U S010522231B2

(12) United States Patent
Noro et al.

(10) Patent No.: US 10,522,231 B2
(45) Date of Patent: Dec. 31, 2019

(54) SEMICONDUCTOR MEMORY DEVICE

(71) Applicant: Toshiba Memory Corporation, Minato-ku (JP)

(72) Inventors: Hiromi Noro, Kawasaki (JP); Tetsuya Fujita, Kawasaki (JP); Keiji Maruyama, Kawasaki (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 16/121,069

(22) Filed: Sep. 4, 2018

(65) Prior Publication Data

US 2019/0259460 A1 Aug. 22, 2019

(30) Foreign Application Priority Data

Feb. 21, 2018 (JP) .................................. 2018-028623

(51) Int. Cl.
| | |
|---|---|
| *G11C 16/32* | (2006.01) |
| *G11C 16/04* | (2006.01) |
| *G11C 16/10* | (2006.01) |
| *G11C 16/26* | (2006.01) |
| *G11C 7/06* | (2006.01) |

(Continued)

(52) U.S. Cl.
CPC ............... *G11C 16/32* (2013.01); *G11C 7/06* (2013.01); *G11C 7/1057* (2013.01); *G11C 7/1084* (2013.01); *G11C 7/222* (2013.01); *G11C 16/0483* (2013.01); *G11C 16/10* (2013.01); *G11C 16/26* (2013.01); *H01L 27/11582* (2013.01)

(58) Field of Classification Search
CPC ......... G11C 16/32; G11C 7/06; G11C 7/1057; G11C 7/1084; G11C 7/222; G11C 16/0483; G11C 16/10; G11C 16/26; H01L 27/11582
See application file for complete search history.

(56) References Cited

U.S. PATENT DOCUMENTS 5,835,956 A * 11/1998 Park ..................... G11C 11/4076
711/167
5,838,990 A * 11/1998 Park ..................... G11C 11/4076
710/14

(Continued)

FOREIGN PATENT DOCUMENTS

| JP | 3727778 | 12/2005 |
|---|---|---|
| JP | 2006-92643 | 4/2006 |

(Continued)

*Primary Examiner* — Gene N Auduong
(74) *Attorney, Agent, or Firm* — Oblon, McClelland, Maier & Neustadt, L.L.P.

(57) ABSTRACT

According to one embodiment, a semiconductor memory device includes, a memory cell array, a first clock signal line, a second clock signal line to which first and second input/output buffer circuits are coupled in the order from one end toward the other end, a first buffer coupled to the one end of the second clock signal line, and a second buffer coupled to the other end of the second clock signal line. When a write operation is performed, a clock signal is input to the first and second input/output buffer circuits through the first buffer, and when a read operation is performed, a clock signal is input to the first and second input/output buffer circuits through the second buffer.

19 Claims, 14 Drawing Sheets

(51) Int. Cl.
    *G11C 7/10*     (2006.01)
    *G11C 7/22*     (2006.01)
    *H01L 27/11582*     (2017.01)

(56) References Cited

U.S. PATENT DOCUMENTS

| | | | |
|---|---|---|---|
| 6,075,393 | A | 6/2000 | Tomita et al. |
| 6,094,727 | A * | 7/2000 | Manning ............... G06F 1/08 |
| | | | 713/400 |
| 6,484,268 | B2 | 11/2002 | Tamura et al. |
| 6,738,918 | B2 | 5/2004 | Toda |
| 8,030,797 | B2 | 10/2011 | Katoh |
| 8,629,548 | B1 | 1/2014 | Andreev et al. |
| 2019/0051369 | A1 * | 2/2019 | Dietrich ............... G11C 29/38 |

FOREIGN PATENT DOCUMENTS

| | | |
|---|---|---|
| JP | 3922765 | 5/2007 |
| JP | 4063392 | 3/2008 |
| JP | 5358913 | 12/2013 |

* cited by examiner

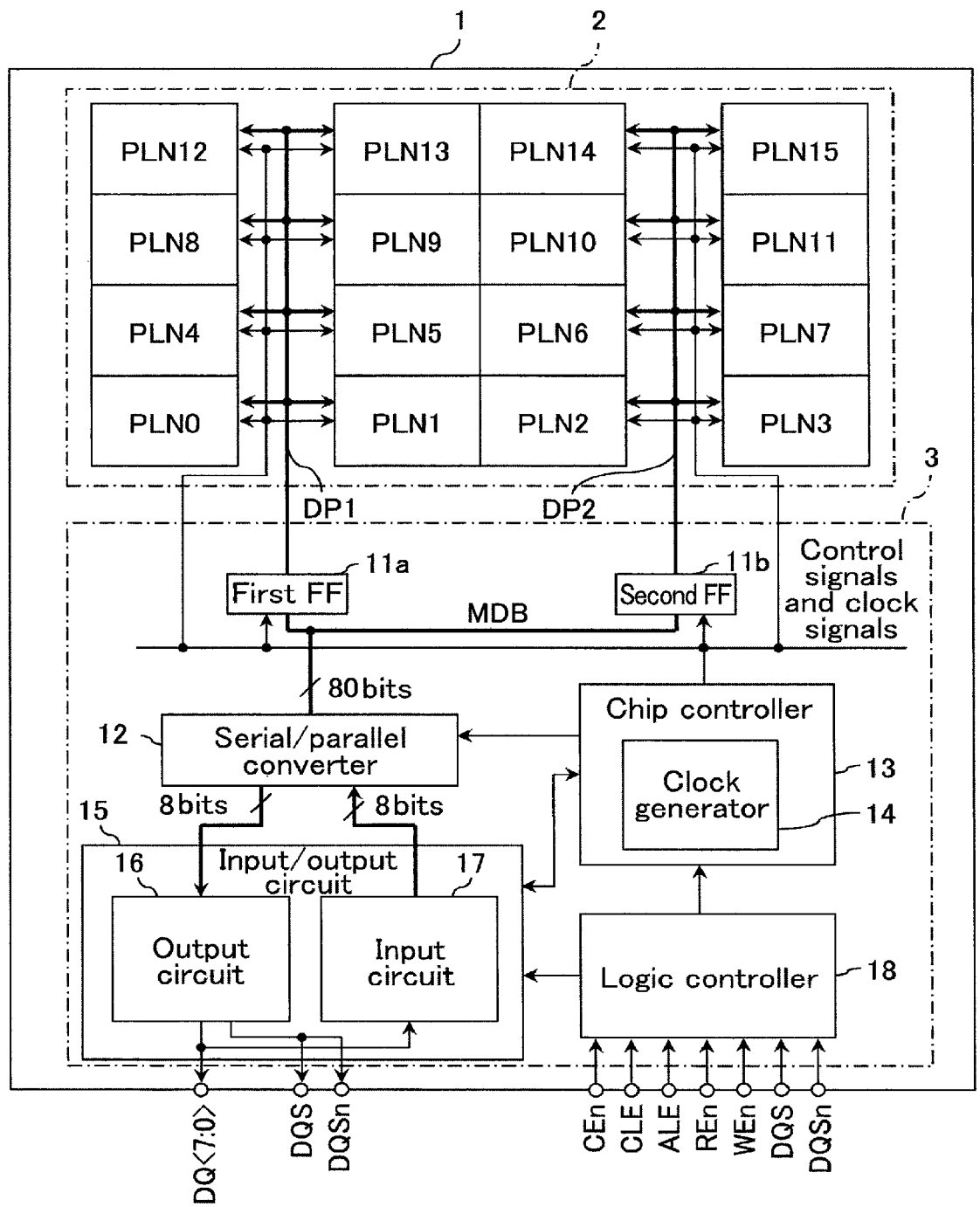
F I G. 1

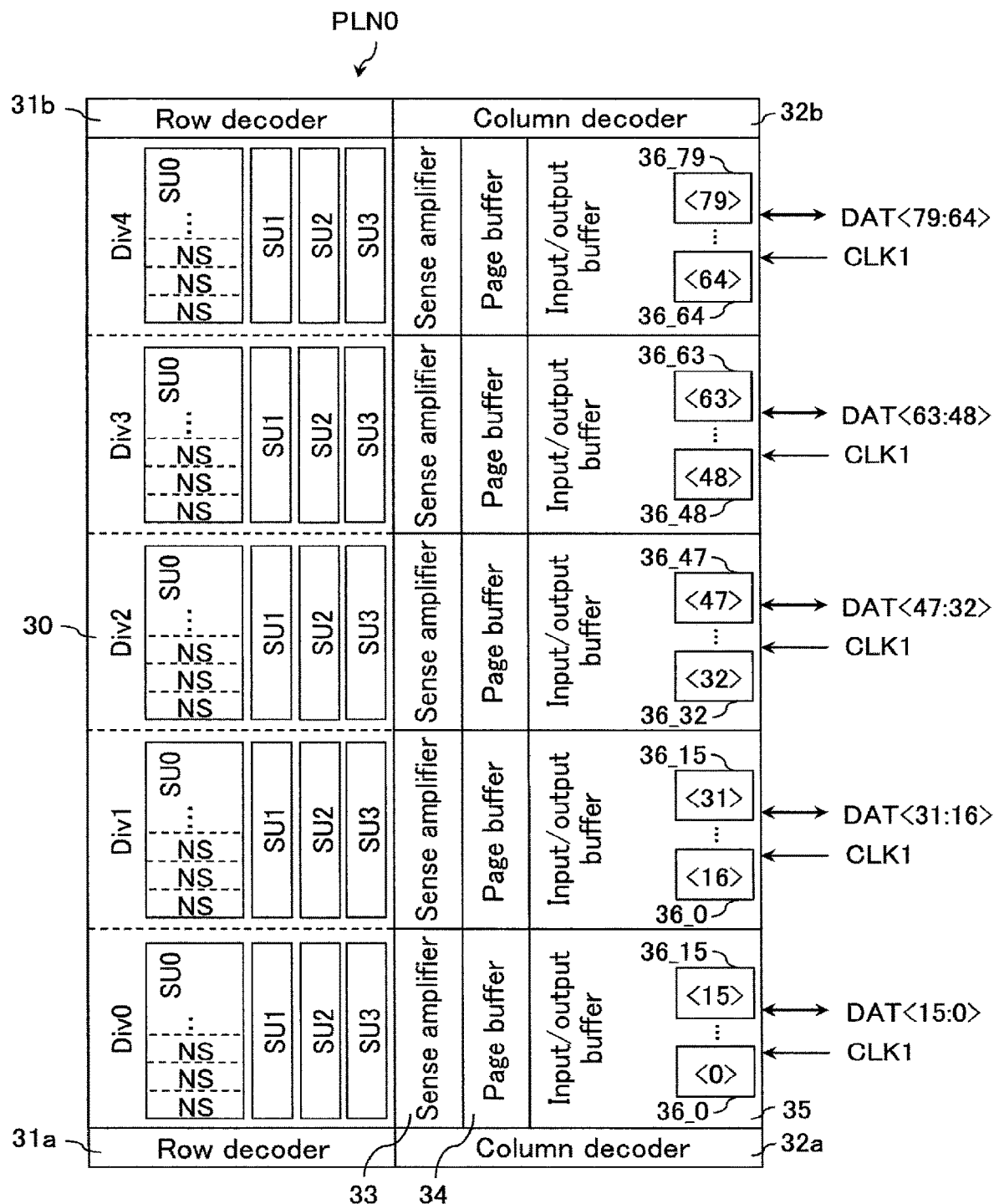
F I G. 2

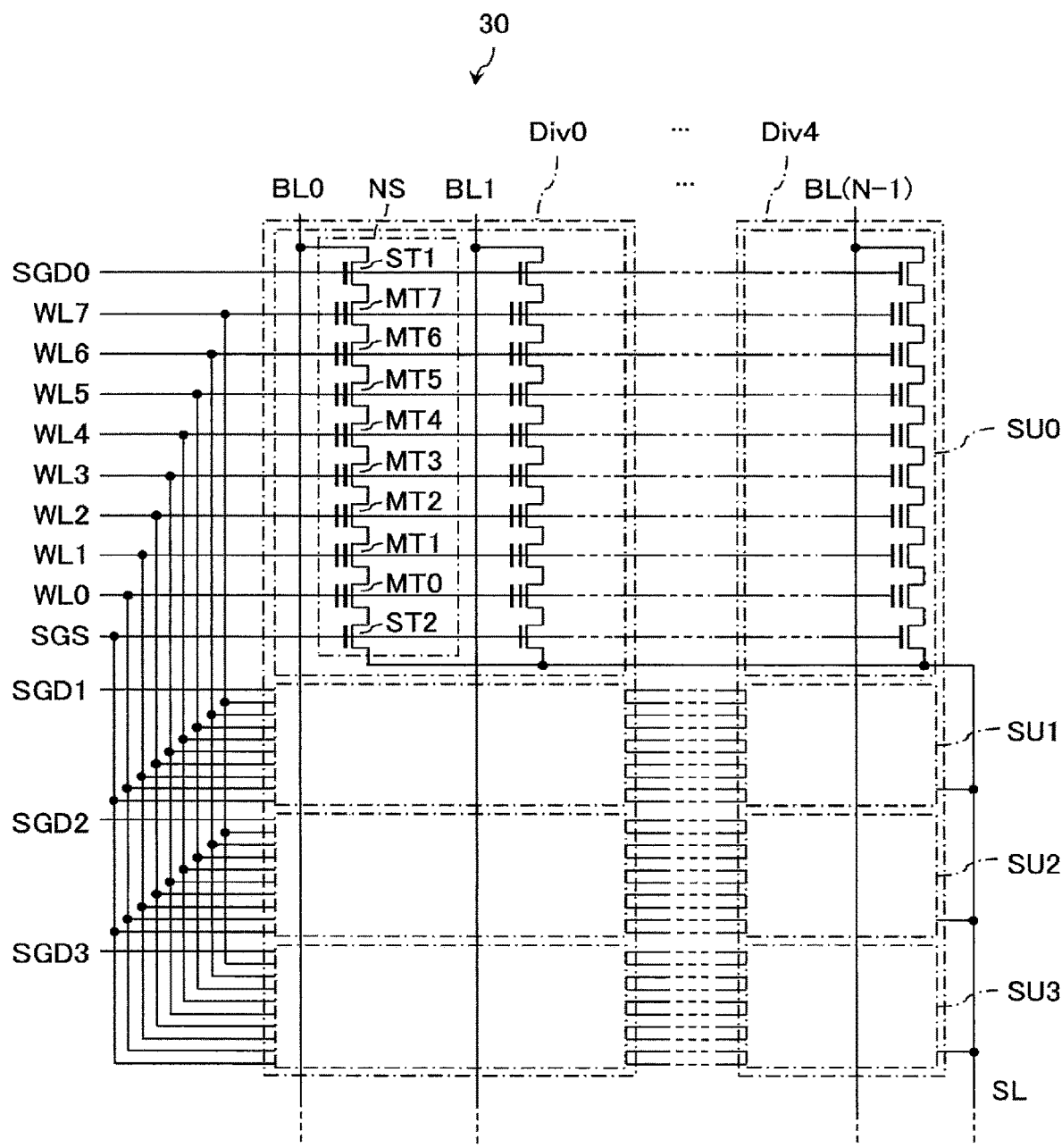
F I G. 3

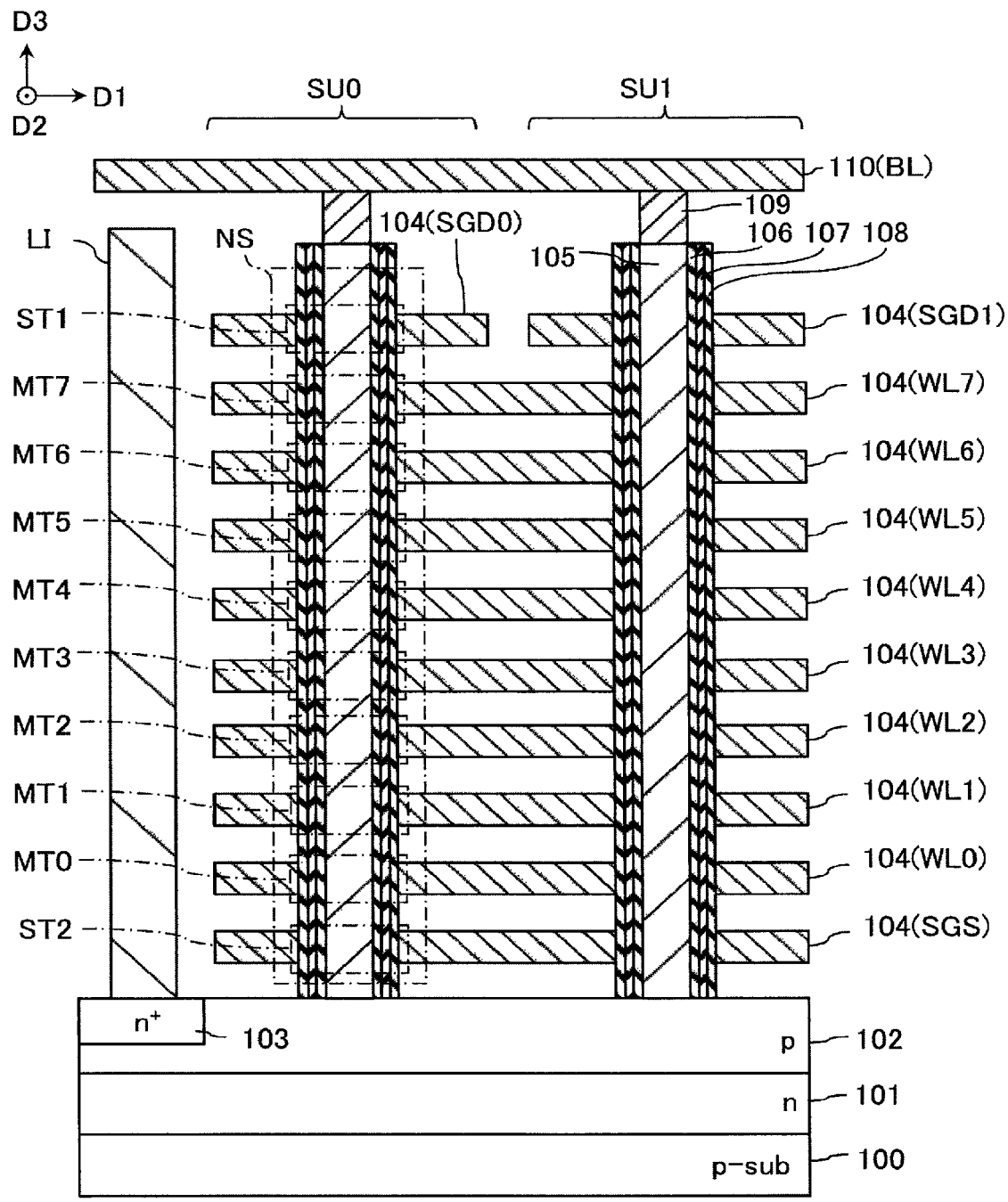
F I G. 4

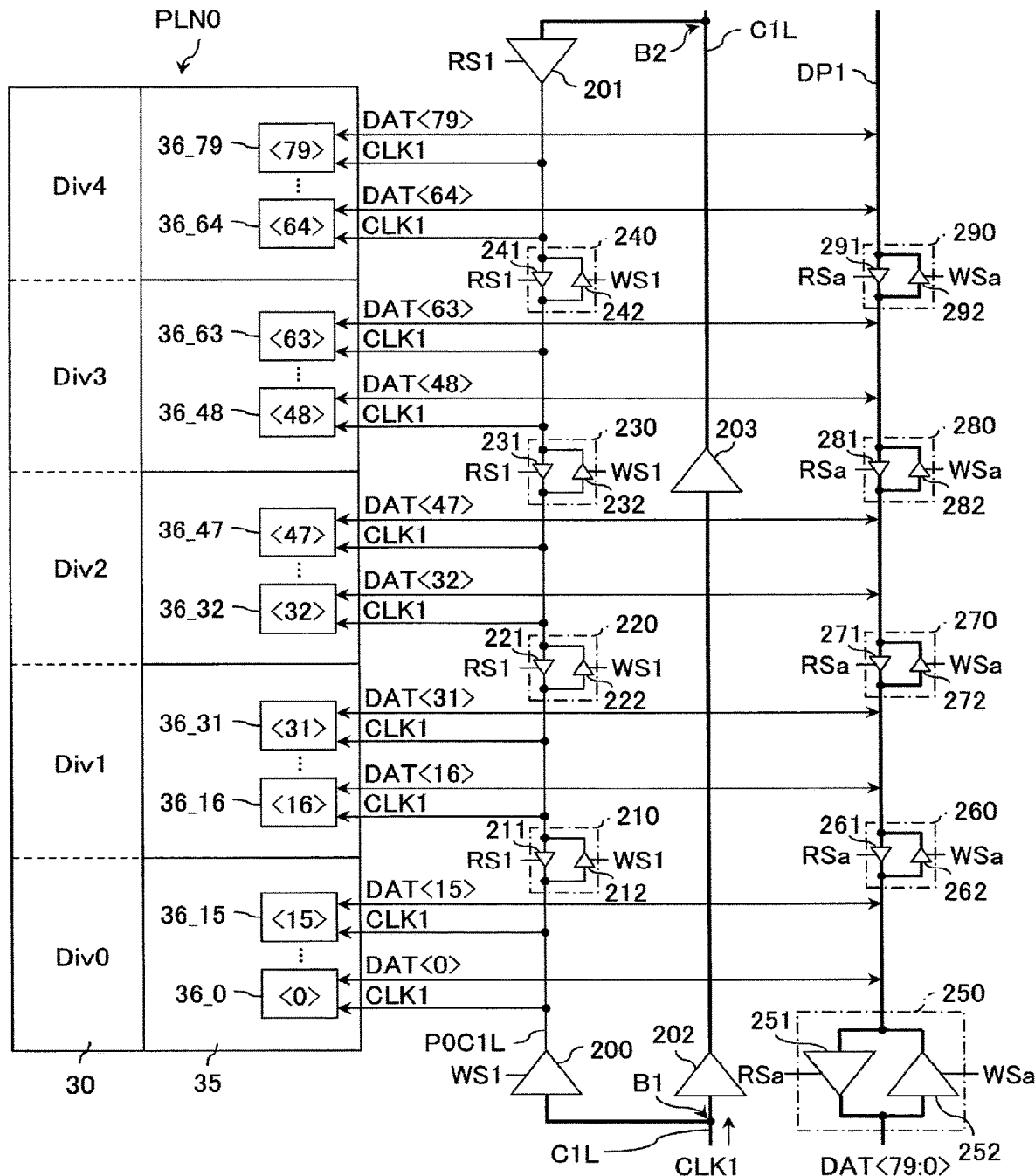
F I G. 5

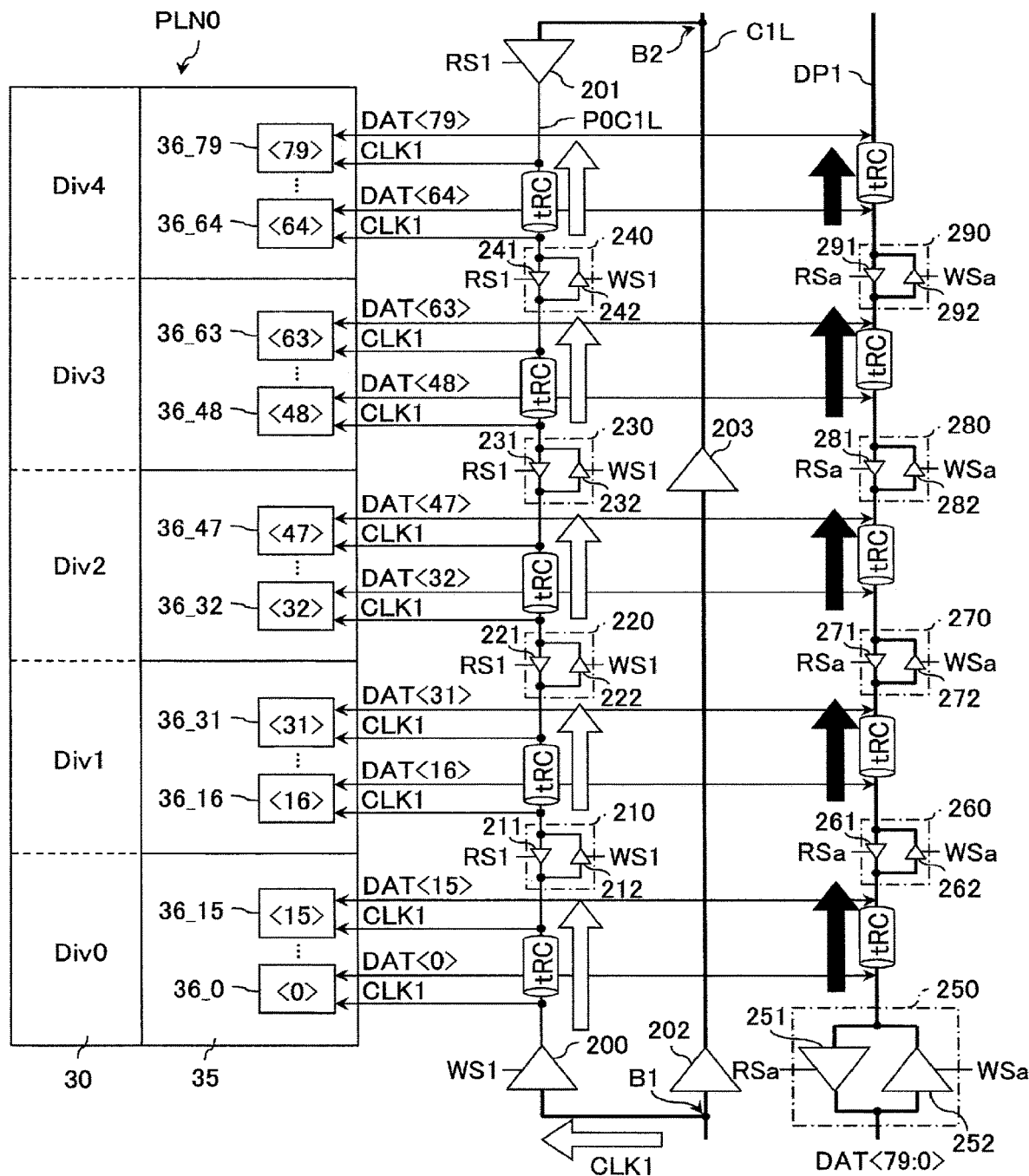
F I G. 6

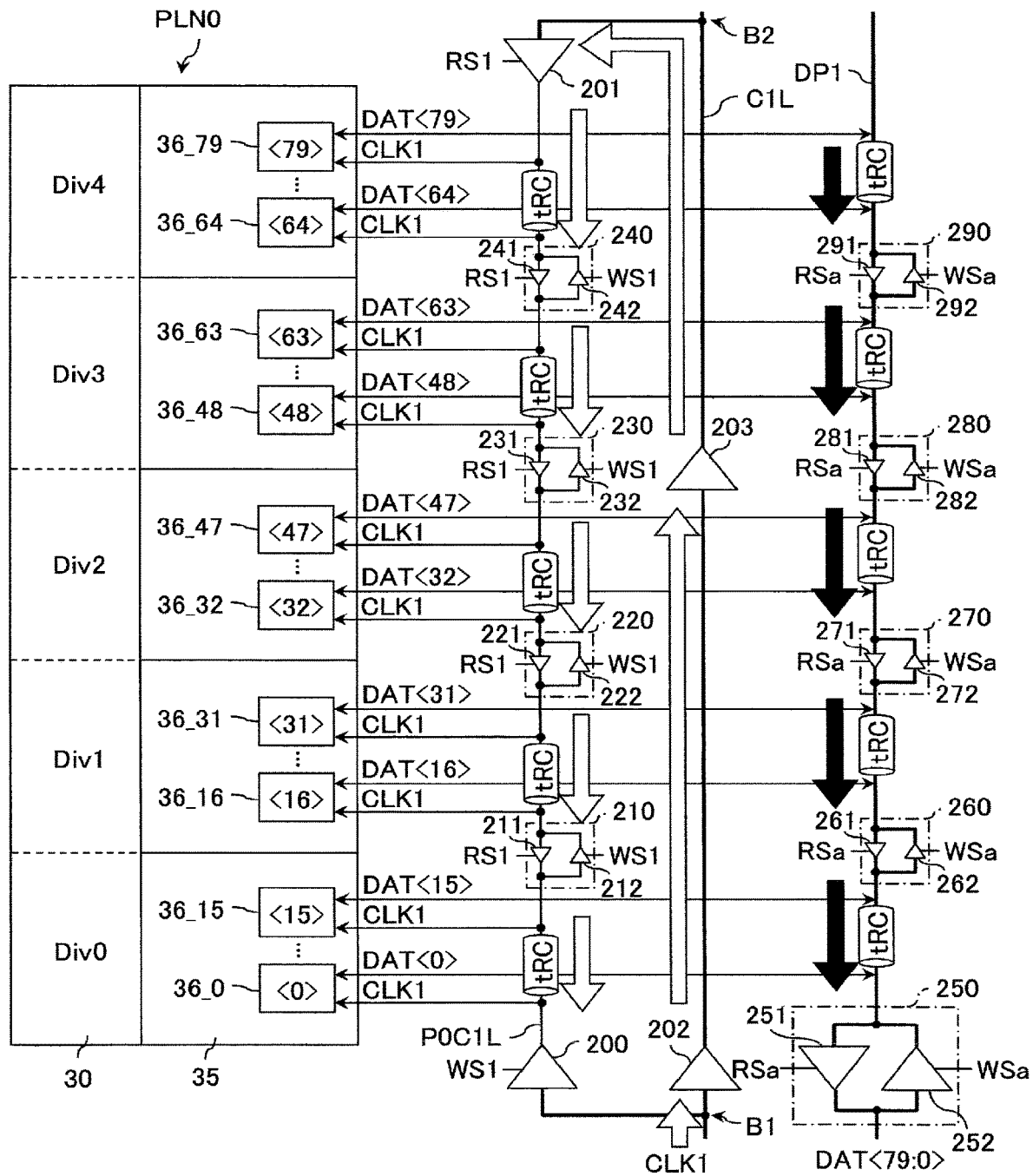
F I G. 7

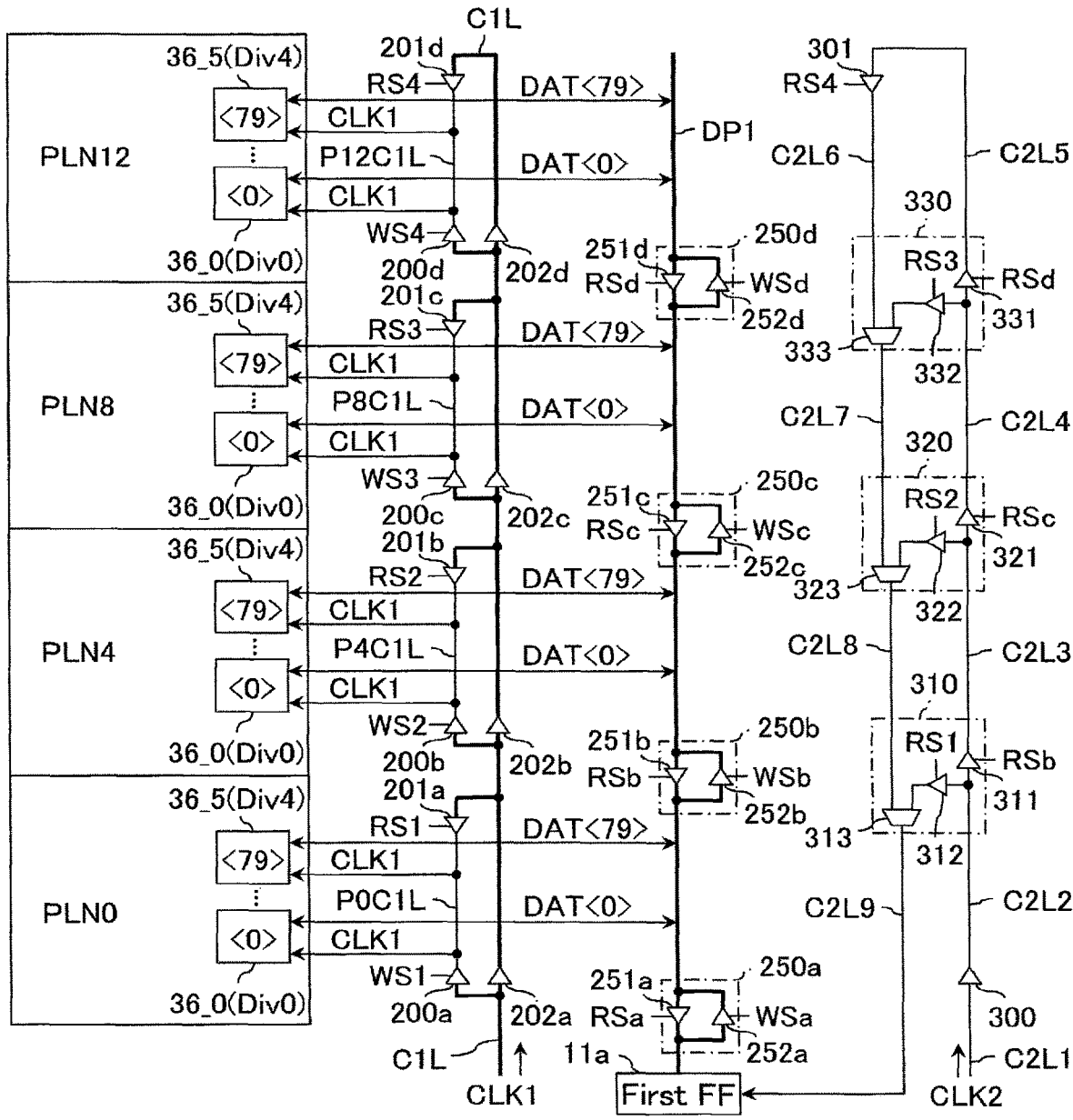
F I G. 10

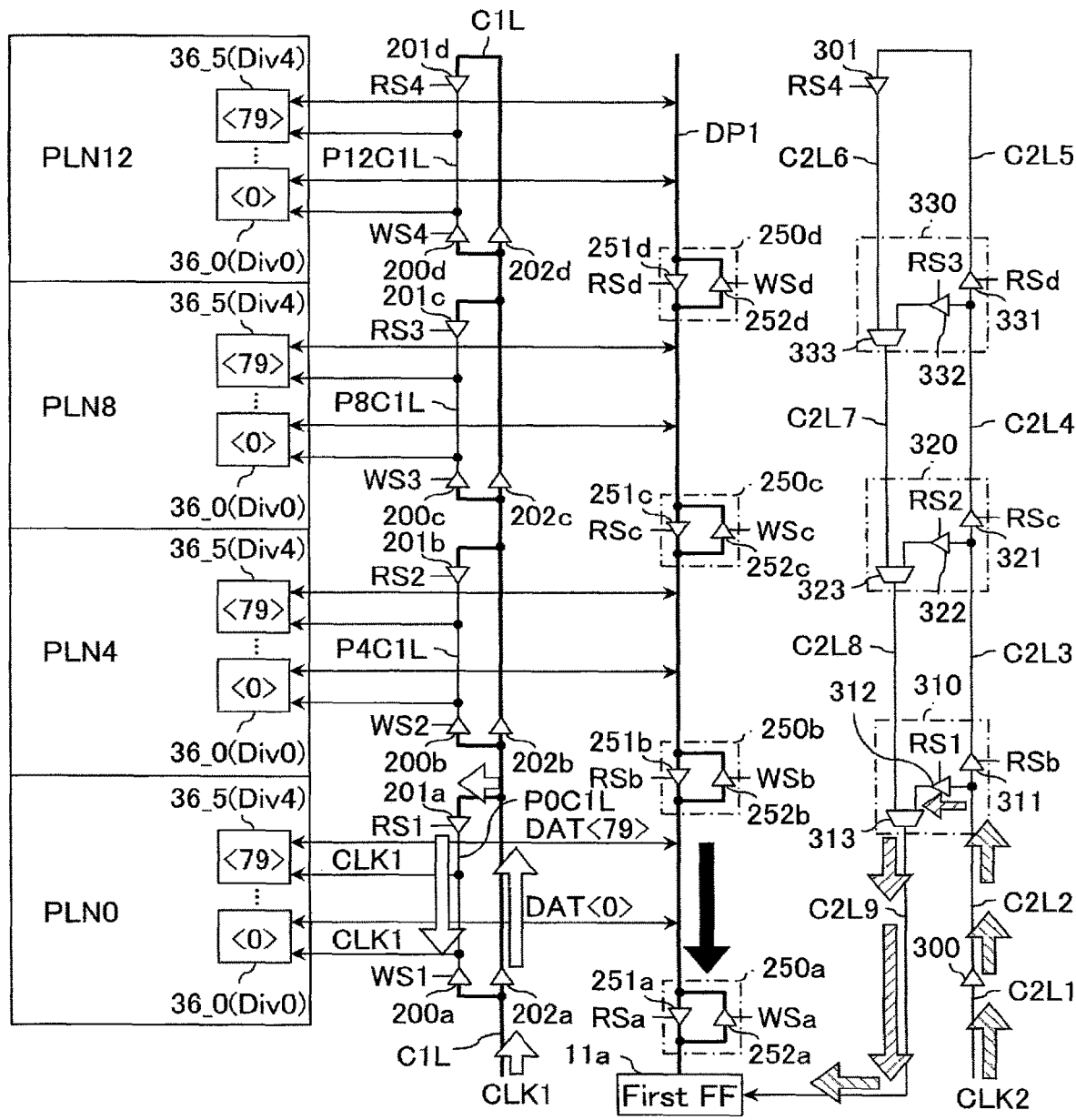
F I G. 11

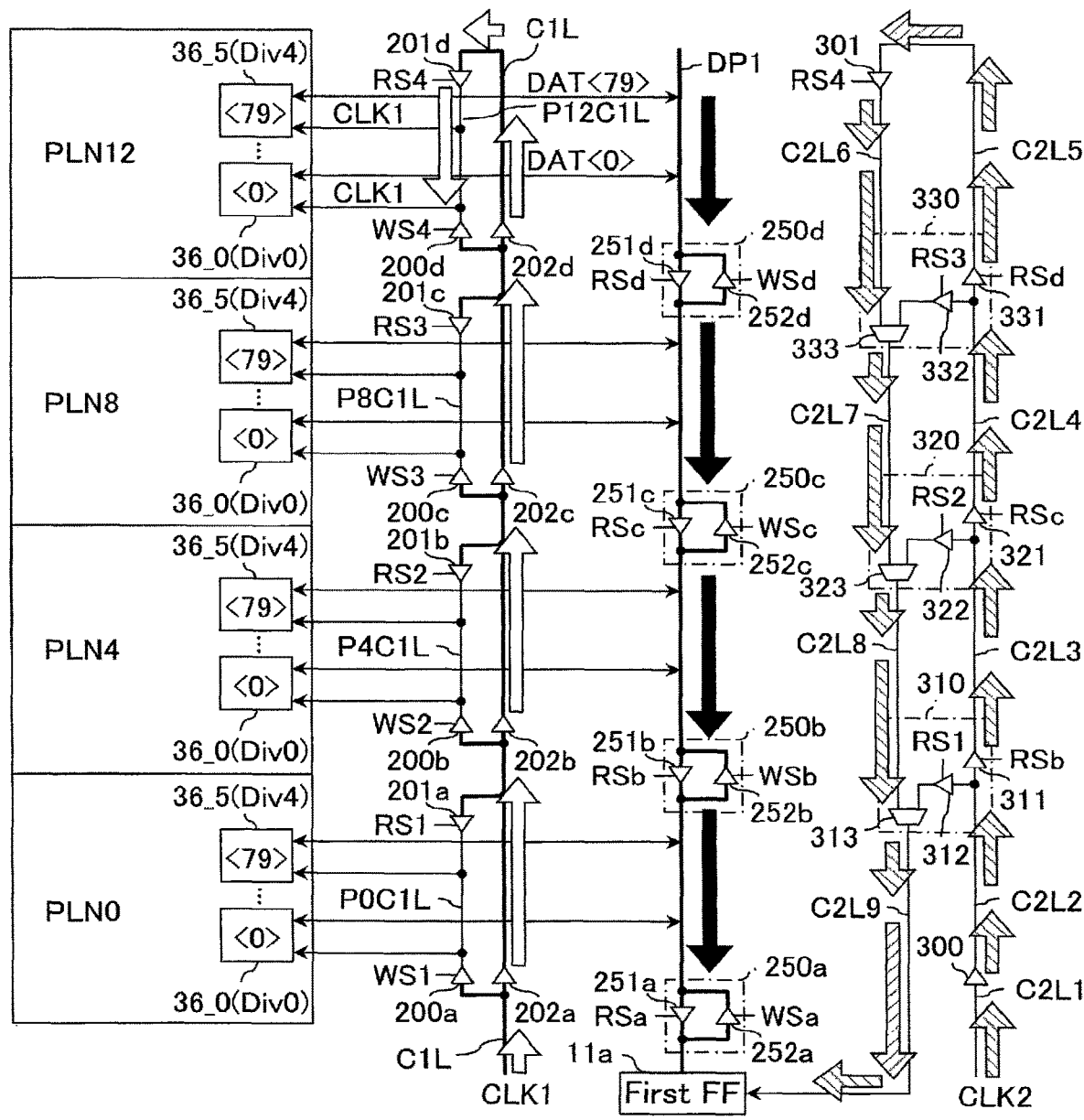
F I G. 12

SEMICONDUCTOR MEMORY DEVICE

CROSS-REFERENCE TO RELATED APPLICATIONS

This application is based upon and claims the benefit of priority from Japanese Patent Application No. 2018-028623, filed Feb. 21, 2018, the entire contents of which are incorporated herein by reference.

FIELD

Embodiments described herein relate generally to a semiconductor memory device.

BACKGROUND

A NAND flash memory is known as a semiconductor memory device.

BRIEF DESCRIPTION OF THE DRAWINGS

FIG. 1 is a block diagram of a semiconductor memory device according to a first embodiment;

FIG. 2 is a block diagram of a plane included in the semiconductor memory device according to the first embodiment;

FIG. 3 is a circuit diagram of a memory cell array included in the semiconductor memory device according to the first embodiment;

FIG. 4 is a sectional view of the memory cell array included in the semiconductor memory device according to the first embodiment;

FIG. 5 is a drawing showing couplings between the plane and clock signal lines and a data bus, which are included in the semiconductor memory device according to the first embodiment;

FIG. 6 is a drawing showing transmission paths for a first clock signal and write data that are transmitted to the plane when a write operation is performed in the semiconductor memory device according to the first embodiment;

FIG. 7 is a drawing showing transmission paths for a first clock signal transmitted to the plane and read data that is read from the plane when a read operation is performed in the semiconductor memory device according to the first embodiment;

FIG. 10 is a drawing showing first clock signal lines and a data bus coupled to planes PLN0, PLN4, PLN8, and PLN12, and second clock signal lines coupled to a first flip-flop circuit, which are included in a semiconductor memory device according to a second embodiment;

FIG. 11 is a drawing showing transmission paths for first and second clock signals when a read operation is performed in plane PLN0 in the semiconductor memory device according to the second embodiment;

FIG. 12 is a drawing showing transmission paths for first and second clock signals when a read operation is performed in plane PLN12 in the semiconductor memory device according to the second embodiment;

DETAILED DESCRIPTION

Figure 8:
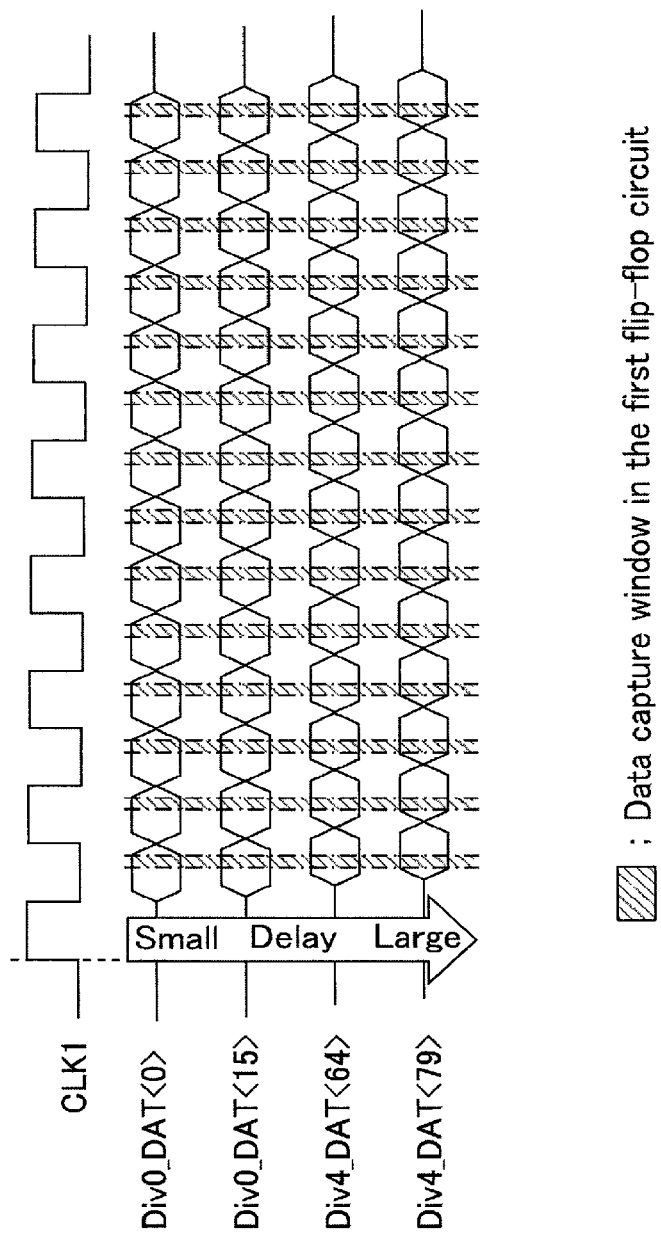
FIG. 8 is a timing chart showing a clock signal and read data when a read operation is performed in a comparative example.

In general, according to one embodiment, a semiconductor memory device includes: a memory cell array including a first memory block and a second memory block, each having a plurality of memory cells; a first input/output buffer circuit that is used for inputting and outputting data to and from the first memory block; a second input/output buffer circuit that is used for inputting and outputting data to and from the second memory block; a clock generator that generates a clock signal; a first clock signal line coupled to the clock generator; a second clock signal line to which the first input/output buffer circuit and the second input/output buffer circuit are coupled to the second clock signal line in the order from one end toward an other end of the second clock signal line; a first buffer in which an input terminal is coupled to the first clock signal line and an output terminal is coupled to the one end of the second clock signal line; and a second buffer in which an input terminal is coupled to the first clock signal line, and an output terminal is coupled to the other end of the second clock signal line. When a write operation is performed, the clock signal is input to the first and second input/output buffer circuits via the first buffer, and when a read operation is performed, the clock signal is input to the first and second input/output buffer circuits via the second buffer.

1. First Embodiment

A semiconductor memory device according to a first embodiment will be described. Hereinafter, a three-dimensional stacked NAND flash memory in which a memory cell transistor is three-dimensionally stacked above a semiconductor substrate will be described as an example of the semiconductor memory device.

1.1 Overall Configuration of Semiconductor Memory Device

First, an overall configuration of a semiconductor memory device will be described using FIG. 1. In the example of FIG. 1, some of the couplings between the blocks are indicated by arrows; however, the couplings in the configuration are not limited those shown in FIG. 1.

As shown in FIG. 1, the semiconductor memory device 1 generally includes a core section 2 and peripheral circuit section 3.

The core section 2 includes, for example, sixteen planes PLN (PLN0 through PLN15). A plane PLN is a unit for performing an operation of writing data to a memory cell transistor and an operation of reading data from a memory cell transistor. Planes PLN0 through PLN15 are independently operable, and also simultaneously operable. Planes PLN0 through PLN15 in the present embodiment have the same configuration. For example, planes PLN0 through PLN15 are arranged in a matrix of 4 rows×4 columns. In the example shown in FIG. 1, planes PLN0, PLN4, PLN8, and PLN12 are arranged in the same column in this order, and planes PLN1, PLN5, PLN9, and PLN 13 are arranged in the same column in this order. These planes PLN are coupled to a first data path DP1 in common. Similarly, planes PLN2, PLN6, PLN10, and PLN14 are arranged in the same column in this order, and planes PLN3, PLN7, PLN11, and PLN15 are arranged in the same column in this order. These planes PLN are coupled to a second data path DP2 in common. Each of the first data path DP1 and the second data path DP2 is an 80-bit bus, for example. It should be noted that the number of bits, in other words, the number of data lines, of each of the first data path DP1 and the second data path DP2 is not limited to 80 bits (80 lines).

The peripheral circuit section 3 includes a first flip-flop circuit 11a, a second flip-flop circuit lib, a serial/parallel converter 12, a chip controller 13, an input/output circuit 15, and a logic controller 18.

The first flip-flop circuit 11a couples the first data path DP1 to a main data bus MDB, and latches data based on a clock signal transmitted from a clock generator 14. The main data bus MDB is, for example, an 80-bit bus, similarly to the first data path DP1 and the second data path DP2. The first flip-flop circuit 11a includes a plurality of flip-flops (not shown) corresponding to an 80-bit bus, that is, 80 data lines.

The second flip-flop circuit 11b couples the second data path DP2 to the main data bus MDB, similarly to the first flip-flop circuit 11a, and latches data based on a clock signal transmitted from the clock generator 14. The second flip-flop circuit 11b includes an 80-bit bus, in other words, a plurality of flip-flops corresponding to 80 data lines (not shown).

The serial/parallel converter 12 performs serial/parallel conversion on data. More specifically, the serial/parallel converter 12 converts data of 80 bits×1 cycle which is received from the main data bus MDB into data of 8 bits×10 cycles, and transmits the data to the output circuit 16. Also the serial/parallel converter 12 converts data of 8 bits×10 cycles which is received from the input/output circuit 17 into data of 80 bits×1 cycle, and outputs the data to the main data bus MDB.

The chip controller 13 controls the entire operation of the semiconductor memory device 1. More specifically, the chip controller 13 controls a write operation, a read operation, and an erase operation in each plane PLN based on various control signals transmitted from the logic controller 18 and various commands transmitted from the input/output circuit. Also the chip controller 13 controls the core section 2, the first flip-flop circuit 11a, the second flip-flop circuit 11b, the serial/parallel converter 12, and the input/output circuit 15, etc. The chip controller 13 includes a clock generator 14.

The clock generator 14 generates various clock signals that are transmitted to each plane PLN, the first flip-flop circuit 11a, the second flip-flop circuit lib, the serial/parallel converter 12, and the input/output circuit 15. More specifically, for example, the clock generator 14 generates a first clock signal to be transmitted to a plane PLN, and a second clock signal to be transmitted to the first flip-flop circuit 11a and the second flip-flop circuit lib. Each of the planes PLN performs inputting and outputting data of the corresponding first data path DP1 and the second data path DP2 based on a received first clock signal. The first flip-flop circuit 11a and the second flip-flop circuit 11b latch data based on a received second clock signal. For example, when a read operation is performed, the clock generator 14 generates a clock signal based on a read enable signal REn, etc., received from an external controller (not shown).

The input/output circuit 15 controls input and output of a signal DQ to and from an external controller. A signal DQ includes data, an address, and a command, for example. The input and output circuit 15 includes an input circuit 17 and an output circuit 16. The input circuit 17 transmits data (i.e., write data) received from an external controller to the serial/parallel converter 12, transmits an address to each plane PLN through a not-shown address register, and transmits a command to the chip controller 13 through a not-shown command register. The output circuit 16 temporarily latches the data (i.e., read data) received from the serial/parallel converter 12 based on a clock signal transmitted from the clock generator 14, and transmits the data along with a clock signal DQS and a complementary clock signal DQSn to an external controller.

The logic controller 18 receives, from an external controller, for example, a chip enable signal CEn, a command latch enable signal CLE, an address latch enable signal ALE, a write enable signal WEn, a read enable signal REn, a clock signal DQS, and a complementary clock signal DQSn. The logic controller 18 controls the input/output circuit 15 and the chip controller 13 in response to a received signal.

The chip enable signal CEn is a signal to enable the semiconductor memory device 1. The command latch enable signal CLE is a signal indicating that the signal DQ is a command. The address latch enable signal ALE is a signal indicating that the signal DQ is an address. The write enable signal WEn is a signal for fetching a received signal into the semiconductor memory device 1, and is asserted every time when a command, an address, and data, etc. are received from an external controller. Accordingly, every time the write enable signal WEn is toggled, the signal DQ is fetched into the semiconductor memory device 1. The read enable signal REn is a signal for an external controller to read data from the semiconductor memory device 1. The semiconductor memory device 1 thus outputs the signal DQ to an external controller based on the toggled read enable signal REn. The clock signal DQS and the complementary clock signal DQSn are signals for controlling a timing of inputting and outputting a signal DQ.

1.2 Configuration of Planes

Next, the configuration of the planes PLN will be described using FIG. 2. The example in FIG. 2 shows plane PLN0, but the other planes PLN also have the same configuration.

As shown in FIG. 2, a plane PLN includes a memory cell array 30, row decoders 31a and 31b, column decoders 32a and 32b, five sense amplifiers 33, five page buffers 34, and five input/output buffers 35.

The memory cell array 30 consists of five division blocks Div (Div0 through Div4), each of which includes a non-volatile memory cell transistor (hereinafter also referred to as "memory cells") associated with rows and columns. Each division block Div includes a plurality of string units SU (SU0, SU1, SU2, and SU3). And each of the string units SU includes a plurality of NAND strings NS. It should be noted that in the example shown in FIG. 2, the NAND strings NS in string units SU1 through SU3 are omitted to simplify the description.

The number of division blocks Div in the memory cell array 30, the number of string units SU in each division block Div, and the number of NAND string NS are discretionary.

The row decoders 31a and 31b decode a row address, and select a corresponding string unit SU based on a result of the decoding. And the row decoders 31a and 31b apply a necessary voltage to a string unit SU.

The column decoders 32a and 32b decode a column address, and select a corresponding sense amplifier 33 and a corresponding latch circuit in the page buffer 34 based on a result of the decoding.

Five sense amplifiers 33 are respectively provided to five division blocks Div0 through Div4. When a read operation is performed, the sense amplifier 33 senses data that is read from a corresponding division block Div. And the sense amplifier 33 transmits the read data to the page buffer 34. Also when a write operation is performed, the sense amplifier 33 transmits write data to a corresponding division block Div.

Five page buffers 34 are provided corresponding to five division blocks Div0 through Div4. The page buffer 34 includes a plurality of latch circuits (not shown) to retain write data and read data. For example, in a write operation, the page buffer 34 temporarily retains write data received from the input/output buffer 35, and transmits the data to the sense amplifier 33. And, for example, in a read operation, the page buffer 34 temporarily retains write data received from the sense amplifier 33, and transmits the data to the input/output buffer 35. In the present embodiment, data transfer between the page buffer 34 and the input/output buffer 35 are performed for a unit of 16 bits.

Five input/output buffers 35 are respectively provided in five division blocks Div0 through Div4, and each of the buffers performs inputting and outputting of 16-bit data DAT to and from the first data path DP1. Hereinafter, input/output data in the input/output buffer 35 corresponding to division block Div0 will be referred to as "data. DAT<15:0>". Similarly, input/output data in the input/output buffer 35 corresponding to division block Div1 will be referred to as "data DAT<31:16>". Input/output data in the input/output buffer 35 corresponding to division block Div2 will be referred to as "data DAT<47:32>". Input/output data in the input/output buffer 35 corresponding to division block Div3 will be referred to as "data DAT<63:48>". Input/output data in the input/output buffer 35 corresponding to division block Div4 will be referred to as "data DAT<79:64>". Accordingly, in one plane PLN, a data path and 80-bit data DAT<79:0> are input and output.

The input/output buffer 35 includes sixteen data input/output circuits 36. Each of the data input/output circuits 36 inputs or outputs 1-bit data DAT based on a first clock signal CLK1 received from the clock generator 14. Hereinafter, in division block Div0, sixteen data input/output circuits 36 corresponding to data DAT<0> through data DAT<15> will be referred to as data input/output circuits 36_0 through 36_15, respectively. Similarly, in division block Div1, sixteen data input/output circuits 36 corresponding to data DAT<16> through data DAT<31> will be referred to as data input/output circuits 36_16 through 36_31. In division block Div2, sixteen data input/output circuits 36 corresponding to data DAT<32> through data DAT<47> will be referred to as data input/output circuits 36_32 through 36_47. In division block Div3, sixteen data input/output circuits 36 corresponding to data DAT<48> through data DAT<63> will be referred to as data input/output circuits 36_48 through 36_63. In division block Div4, sixteen data input/output circuits 36 corresponding to data DAT<64> through data DAT<79> will be referred to as data input/output circuits 36_64 through 36_79.

Each data input/output circuit 36 includes a not-shown flip-flop, and latches data based on a first clock signal CLK1. When a write operation is performed, the data input/output circuits 36 transmit data DAT (write data) that is input through the first data path DP1 to the page buffer 34. And, when a read operation is performed, the data input/output circuits 36 output data received from the page buffer 34 to the first data path DP1. The data input/output circuits 36 may output data to the first data path DP1 in a double data rate (DDR) scheme or in a single data rate (SDR) scheme in accordance with a first clock signal CLK1. In the following, the case where the data input/output circuits 36 output data in the DDR scheme will be described.

It should be noted that plane PLN0 is taken as an example in the above explanation, but other planes PLN have a similar configuration. The input/output buffers 35 of planes PLN1, PLN4, PLN5, PLN8, PLN9, PLN12, and PLN13 are used for inputting and outputting data to and from the first data path DP1, and the input/output buffers 25 of planes PLN2, PLN3, PLN6, PLN7, PLN10, PLN11, PLN14, and PLN15 are used for inputting and outputting data to and from the second data path DP2.

1.3 Configuration of Memory Cell Array

Next, the configuration of the memory cell array will be described using FIGS. 3 and 4. FIG. 3 is a circuit diagram of the memory cell array 30 in plane PLN0, and FIG. 4 is a sectional view of the memory cell array 30. It should be noted that the other planes PLN have the same configuration.

As shown in FIG. 3, each of the NAND strings NS includes eight memory cell transistors MT0 through MT7 and select transistors ST1 and ST2. Hereinafter, in the case of not specifying memory cell transistors MT0 through MT7, the memory cell transistor is indicated as a memory cell transistor MT. Each memory cell transistor MT comprises a control gate and a charge storage layer, and stores data in a nonvolatile manner. In each memory cell transistor MT, a threshold voltage varies in accordance with the number of electrons accumulated in the current storage layer, and information is stored in accordance with this varied threshold voltage. It should be noted that the memory cell transistor MT may be of a MONOS type that uses an insulation film for the charge storage layer, or may be of an FG type that uses a conductive layer for the charge storage layer. In the following, in the present embodiment, a MONOS-type memory cell transistor will be described as an example. Also the number of memory cell transistors MT is not limited to eight, and may be 16, 32, 64, 128, etc., and the number is not limited these numbers. Moreover, the number of each of select transistors ST1 and ST2 is discretionary as long as there are at least one of each.

The memory cell transistors MT are coupled in series between the source of select transistor ST1 and the drain of select transistor ST2. More specifically, the current paths of memory cell transistors MT0 through MT7 thereof are coupled in series. And the drain of memory cell transistor MT7 is coupled to the source of select transistor ST1, and the source of memory cell transistor MT0 is coupled to the drain of select transistor ST2.

The gates of select transistors ST1 respectively included in string units SU0 through SU3 in each of division blocks Div0 through Div4 are respectively coupled in common to select gate lines SGD0 through SGD3. In other words, each of select gate lines SGD0 through SGD3 is coupled in common to the NAND strings NS in each string unit SU among the plurality of division blocks Div. Select gate lines SGD0 through SGD3 are coupled to one of the row decoders 31a and 31b. Hereinafter, in the case of not specifying select gate lines SGD0 through SGD3, the select gate line is indicated as a select gate line SGD.

The gates of select transistors ST2 respectively included in string units SU0 through SU3 in each of division blocks Div0 through Div4 are respectively coupled in common to select gate line SGS.

The control gates of memory cell transistors MT0 through MT7 in the memory cell array 30 are respectively coupled to word lines WL0 through WL7 in common. In other words, word lines WL0 through WL7 are respectively coupled to memory cell transistors MT0 through MT7 in common in the plurality of division blocks Div. Word lines WL0 through WL7 are coupled to one of the row decoders 31a and 31b. Hereinafter, in the case of not specifying word lines WL0 through WL7, the word line is indicated as a word line WL.

The drain of select transistor ST1 of each NAND string NS in a string unit SU of division blocks Div0 through Div4 is coupled to different bit lines BL0 through BL(N−1) (N is an integer of 2 or more). Each of bit lines BL0 through BL(N−1) is coupled to the sense amplifier 33 of each corresponding division block Div. Hereinafter, in the case of not specifying the bit lines BL0 through BL(N−1), the bit line is indicated as a bit line BL. Moreover, the sources of the plurality of select transistors ST2 are coupled in common to the source line SL. A write operation and a read operation are performed as a batch on the memory cell transistor MT coupled to one of the word lines WL in one of the string units SU.

Next, the configuration of the memory cell array 30 will be described with reference to a sectional view thereof. The example of FIG. 4 shows a cross section of string units SU0 and SM. String units SU2 and SU3 also have the same configuration. It should be noted that in FIG. 4, interlayer insulation films are omitted.

As shown in FIG. 4, a source line contact L1, and a plurality of string units SU are arranged along the first direction D1 which is parallel to the semiconductor substrate 100, and the source line contact L1 extends in a second direction D2 which is perpendicular to the first direction D1. The source line contact L1 couples the semiconductor substrate 100 and a source line SL (not shown) that is arranged above the NAND strings NS. It should be noted that the arrangement of the source line contact L1 and the NAND strings NS may be discretionarily set. For example, the source line contact L1 may be arranged between string units SU1 and SU2. Furthermore, in the example of FIG. 4, a plurality of NAND strings NS are arranged in one line along the second direction D2 in one string unit SU to simplify the explanation; however, the arrangement of the NAND strings NS in one string unit SU may be discretionarily set. For example, two lines of the NAND strings NS may be arranged in parallel along the second direction D2, or the NAND strings NS may be staggered in four lines.

In each string unit SU, a NAND string NS is formed along a third direction D3 perpendicular to the semiconductor substrate 100. More specifically, an n-type well 101 is provided on the surface region of the semiconductor substrate 100. And a p-type well 102 is provided on the surface region of the n-type well 101. Also an $n^+$-type diffusion layer 103 is provided in a part of surface region of the p-type well 102. And above the p-type well 102, ten interconnect layers 104 functioning as select gate line SGS, word lines WL0 through WL7 coupled to memory cell transistors MT0 through MT7, and select gate line SGD are stacked in the order, with interlayer insulation films (not shown) being respectively interposed between the interconnect layers 104. The interconnect layer 104 functioning as select gate line SGD is separated for each string unit SU, and in the example of FIG. 4, the interconnect layer 104 is separated so that the layer 104 extends in the second direction D2 and functions as select gate line SGD0 and select gate line SGD1 which are provided on the same layer. The other interconnect layers 104 are common in the block Div.

Also, a pillar-shaped semiconductor layer 105 that penetrates the interconnect layers 104 and reaches the p-type well 102 is formed. On the side surface of the semiconductor layer 105, a tunnel insulation film 106, a charge storage layer 107, and a block insulation film 108 are formed in the order. Polycrystalline silicon, for example, is used for the semiconductor layer 105. A silicon dioxide film, for example, is used for the tunnel insulation film 106 and the block insulation film 108. A silicon nitride film, for example, is used for the charge storage layer 107. The semiconductor layer 105 functions as the current path of the NAND strings NS and becomes a region where a channel of each transistor is formed. And the upper end of the semiconductor layer 105 is coupled via the contact plug 109 to the interconnect layer 110 which extends in the first direction D1. The interconnect layer 110 functions as a bit line BL. It should be noted that in the example of FIG. 4, one interconnect layer 104 functioning as the select gate line SGD and one interconnect layer 104 functioning as the select gate line SGS are provided, but a plurality of layers may be provided.

The source line contact L1 has a shape of line along the second direction D2. Polycrystalline silicon, for example, is used for the source line contact L1. And a bottom surface of the source line contact L1 is coupled to the $n^+$-type diffusion layer 103, and an upper surface of the source line contact L1 is coupled to an interconnect layer (not shown) that functions as the source line SL.

1.4 Configuration of Clock Signal Line and Data Path

Next, the configuration of a clock signal line and a data path will be described using FIG. 5. The example of FIG. 5 shows couplings between plane PLN0 and first data path DP1 and between plane PLN0 and signal lines for the first clock signal CLK1, and a layout of the plane PLN0, first data path DP1, and the signal lines. The couplings between the other planes PLN and the data path and between the other planes PLN and the clock signal lines are similar to this example. It should be noted that in the example of FIG. 5, the row decoders 31a and 31b, the column decoders 32a and 32b, the sense amplifier 33, and the page buffer 34 in plane PLN0 are omitted to simplify the explanation.

As shown in FIG. 5, a first clock signal CLK1 is transmitted to each plane PLN via the first clock signal line C1L. In the example shown in FIG. 5, a first clock signal CLK1 is transmitted via the first clock signal line C1L from the bottom toward the top of the drawing sheet. One end of the first clock signal line C1L is coupled to the clock generator 14. The first clock signal line C1L is made of a wire having relatively low resistance so as to reduce an RC delay in the first clock signal CLK1 in the first clock signal line C1L, and for example, buffers 202 and 203 functioning as a high-power driver for relaying the signal lines are provided in the path of the signal line. It should be noted that the number of buffers to be coupled to the first clock signal line C1L can be discretionarily set.

Plane PLN0 is coupled to clock signal line P0C1L for the plane PLN0, which branches off from the first clock signal line C1L. More specifically, the first clock signal line C1L and the clock signal P0C1L are arranged along the data input/output circuits 36_0 through 36_79 included in the input/output buffers 35 of division blocks Div0 through Div4. The first clock signal line C1L branches off at two branch points B1 and B2 corresponding to plane PLN0, and is coupled to the clock signal line P0C1L via two three-state buffers 200 and 201. Branch point B1 is provided closer to the clock generator 14 in the first clock signal line C1L than branch point B2. Accordingly, the clock signal line P0C1L may transmit a first clock signal CLK1 from the bottom toward the top of the drawing sheet via branch point B1 and the three-state buffer 200, or may transmit a first clock signal CLK1 from the top toward the bottom of the drawing sheet via branch point B2 and the three-state buffer 201. In other words, a first clock signal CLK1 can be transmitted in two directions in the clock signal line P0C1L. Although the details will be described later, the chip controller 13 changes the transmitting direction of a first clock signal CLK1 in the clock signal line P0C1L in accordance with a write operation and a read operation.

A first clock signal CLK1 is input to the input terminal of the three-state buffer 200 via branch point B1, and the output terminal is coupled to one end of the clock signal line P0C1L. A control signal WS1 received from the chip controller 13 is input to the control terminal of the three-state buffer 200. A control signal WS1 is set to high ("H") level when a write operation is performed in plane PLN0. When the control signal WS1 is at "H" level, the three-state buffer 200 transmits a first clock signal CLK1 to the clock signal line P0C1L, and when the control signal WS1 is at low ("L") level, the three-state buffer 200 is in a high-impedance state.

A first clock signal CLK1 is input to the input terminal of the three-state buffer 201 via branch point B2, and the output terminal is coupled to the other end of the clock signal line P0C1L. A control signal RS1 received from the chip controller 13 is input to the control terminal of the three-state buffer 201. The control signal RS1 is set to "H" level when data is read from plane PLN0. When the control signal RS1 is at "H" level, the three-state buffer 201 transmits a first clock signal CLK1 to the clock signal line P0C1L, and when the control signal RS1 is at "L" level, the three-state buffer 201 is in a high-impedance state.

Accordingly, the three-state buffers 200 and 201 function as bidirectional buffer circuits for changing the transmitting direction of a first clock signal CLK1 in the clock signal line P0C1L based on the control signals WS1 and RS1. It should be noted that when the control signals RS1 and WS1 are at "H" level, the three-state buffers 200 and 201 are in a high-impedance state, and the clock signal line P0C1L is in a floating state. For example, to avoid a floating state, a latch circuit may be provided on the clock signal line P0C1L to retain a most-recent potential state.

In the path of the clock signal line P0C1L, four bidirectional buffer circuits 210, 220, 230, and 240 are provided. The bidirectional buffer circuits 210, 220, 230, and 240 change the transmitting direction of a first clock signal CLK1 in the clock signal line P0C1L based on the control signals WS1 and RS1 when a write operation and a read operation are performed in plane PLN0. From one end of the clock signal line P0C1L coupled to the three-state buffer 200 toward the other end of the clock signal line P0C1L coupled to the three-state buffer 201, the data input/output circuits 36_0 through 36_15, the bidirectional buffer circuit 210, the data input/output circuits 36_16 through 36_31, the bidirectional buffer circuit 220, the data input/output circuits 36_32 through 36_47, the bidirectional buffer circuit 230, the data input/output circuits 36_48 through 36_63, the bidirectional buffer circuit 240, and the data input/output circuits 36_64 through 36_79 are coupled to the clock signal line P0C1L in this order.

The bidirectional buffer circuit 210 includes two three-state buffers 211 and 212. The input terminal of the three-state buffer 211 is coupled with the clock signal line P0C1L extending from the three-state buffer 201, the output terminal is coupled with the clock signal line P0C1L extending toward the three-state buffer 200, and the control signal RS1 is input to the control terminal. And the input terminal of the three-state buffer 212 is coupled with the clock signal line P0C1L extending from the three-state buffer 200, the output terminal is coupled with the clock signal line P0C1L extending toward the three-state buffer 201, and the control signal WS1 is input to the control terminal.

Similarly, the bidirectional buffer circuit 220 includes two three-state buffers 221 and 222. The input terminal of the three-state buffer 221 is coupled with the clock signal line P0C1L extending from the three-state buffer 201, the output terminal is coupled with the clock signal line P0C1L extending toward the three-state buffer 200, and the control signal RS1 is input to the control terminal. Also the input terminal of the three-state buffer 222 is coupled with the clock signal line P0C1L extending from the three-state buffer 200, the output terminal is coupled with the clock signal line P0C1L extending toward the three-state buffer 201, and the control signal WS1 is input to the control terminal.

The bidirectional buffer circuit 230 includes two three-state buffers 231 and 232. The input terminal of the three-state buffer 231 is coupled with the clock signal line P0C1L extending from the three-state buffer 201, the output terminal is coupled with the clock signal line P0C1L extending toward the three-state buffer 200, and the control signal RS1 is input to the control terminal. The input terminal of the three-state buffer 232 is coupled with the clock signal line P0C1L extending from the three-state buffer 200, the output terminal is coupled with the clock signal line P0C1L extending toward the three-state buffer 201, and the control signal WS1 is input to the control terminal.

The bidirectional buffer circuit 240 includes two three-state buffers 241 and 242. The input terminal of the three-state buffer 241 is coupled with the clock signal line P0C1L extending from the three-state buffer 201, the output terminal is coupled with the clock signal line P0C1L extending toward the three-state buffer 200, and the control signal RS1 is input to the control terminal. The input terminal of the three-state buffer 242 is coupled with the clock signal line P0C1L extending from the three-state buffer 200, the output terminal is coupled with the clock signal line P0C1L extending toward the three-state buffer 201, and the control signal WS1 is input to the control terminal.

Next, the coupling of first data path DP1 will be described. One end of first data path DP1 is coupled to the first flip-flop circuit 11a. In the path of first data path DP1, five bidirectional buffer circuits 250, 260, 270, 280, and 290 are provided. More specifically, first data path DP1 is arranged along the first clock signal line C1L and the clock signal line P0C1L. From one end toward the other end of first data path DP1 coupled to the first flip-flop circuit 11a, the bidirectional buffer circuit 250, the data input/output circuits 36_0 through 36_15, the bidirectional buffer circuit 260, the data input/output circuits 36_16 through 36_31, the bidirectional buffer circuit 270, the data input/output circuits 36_32 through 36_47, the bidirectional buffer circuit 280, the data input/output circuits 3648 through 36_63, the bidirectional buffer circuit 290, and the data input/output circuits 36_64 through 36_79 are coupled to first data path DP1 in this order. The bidirectional buffer circuits 250, 260, 270, 280, and 290 change the transmitting direction of data DAT<79:0> in first data path DP1 when a write operation and a read operation, etc. are performed in one of the planes PLN coupled to the first data path DP1.

The bidirectional buffer circuit 250 includes two three-state buffers 251 and 252. The input terminal of the three-state buffer 251 is coupled with first data path DP1 extending from each plane PLN, the output terminal is coupled with first data path DP1 extending toward the first flip-flop circuit 11a, and the control signal RSa received from the chip controller 13 is input to the control terminal. The control signal RSa is set to "H" level when data is read from one of the planes PLN coupled with first data path DP1. And the input terminal of the three-state buffer 252 is coupled with first data path DP1 extending from the first flip-flop circuit 11a, the output terminal is coupled with first data path DP1 extending toward each plane PLN, and the control signal WSa is input to the control terminal. The control signal WSa is set to "H" level when data is written in one of the planes PLN coupled with first data path DP1.

The configurations of the bidirectional buffer circuits 260, 270, 280, and 290 are the same as the configuration of the bidirectional buffer circuit 250. The bidirectional buffer circuit 260 includes two three-state buffers 261 and 262. The bidirectional buffer circuit 270 includes two three-state buffers 271 and 272. The bidirectional buffer circuit 280 includes two three-state buffers 281 and 282. The bidirectional buffer circuit 290 includes two three-state buffers 291 and 292. The three-state buffers 261, 271, 281, and 291 correspond to the three-state buffer 251 in the bidirectional buffer circuit 250, and the control signal RSa is input to the control terminal of each of the buffers. The three-state buffers 262, 272, 282, and 292 correspond to the three-state buffer 252 in the bidirectional buffer circuit 250, and the control signal WSa is input to the control terminal of each of the buffers.

1.5 Specific Example of Transmission of Data and First Clock Signal

Next, a specific example of transmission of data and a first clock signal will be described.

1.5.1 Example of Write Operation

First, transmission of data and a first clock signal CLK1 when a write operation is performed will be described using FIG. 6. The example of FIG. 6 shows a transmission path of write data DAT<79:0> and a first clock signal CLK1 when a write operation is performed in plane PLN0.

As shown in FIG. 6, the chip controller 13 sets the control signals WS1 and WSa to "H" level, and the control signals RS1 and RSa to "L" level. Thus, the three-state buffers 200, 212, 222, 232, 242 are in an operating state in the path of the first clock signal line C1L and the clock signal line P0C1L. And the three-state buffers 252, 262, 272, 282, and 292 are in an operating state in the path of the first data path DP1. As a result, in the clock signal line P0C1L, the first clock signal CLK1 is transmitted from the three-state buffer 200 toward the three-state buffers 212, 222, 232, and 242. Also write data DAT<79:0> is transmitted from the three-state buffer 252 toward the three-state buffers 262, 272, 282, and 292. Thus, the transmitting direction of the first clock signal CLK1 in the clock signal line P0C1L and the transmitting line of the data DAT in the first data path DP1 are the same.

In the clock signal line P0C1L and the first data path DP1, assume that tRC is an amount of interconnect delay between the buffers, and tBD is an amount of buffer delay due to each buffer. For example, a buffer delay (tBD) due to the three-state buffer 252 occurs in the data DAT<0> that is input to the data input/output circuit 36_0 of division block. Div0, and a buffer delay (tBD) due to the three-state buffer 200 occurs in the first clock signal CLK1. Accordingly, an amount of delay in the data DAT<0> and the first clock signal CLK1 in the data input/output circuit 36_0 can be expressed as follows:

An amount of delay in the data DAT<0>: 0×tRC+1×tBD

An amount of delay in the first clock signal CLK1: 0×tRC+1×tBD

It can be understood, in other words, that an amount of delay in the data DAT<0> and the first clock signal CLK1 in the data input/output circuit 36_0 are almost the same or are synchronized.

Also in the data DAT<79> that is input to the input/output circuit 36_79 of division block Div4, a buffer delay (5×tBD) occurs due to the three-state buffers 252, 262, 272, 282, and 292, and an interconnect delay (5×tRC) occurs in the interconnect from the three-state buffer 252 to the data input/output circuit 36_79. Similarly, in the first clock signal CLK1 that is input to the data input/output circuit 36_79, a buffer delay (5×tBD) occurs due to the three-state buffers 200, 212, 222, 232, and 242, and an interconnect delay (5×tRC) occurs in the interconnect from the three-state buffer 200 to the data input/output circuit 36_79. Accordingly, an amount of delay in the data DAT<79> and an amount of delay in the first clock signal CLK1 in the data input/output circuit 36_79 can be expressed as follows:

An amount of delay in the data DAT<79>: 5×tRC+5×tBD

An amount of delay in the first clock signal CLK1: 5×tRC+5×tBD

It can be understood, in other words, that an amount of delay in the data DAT<79> and the first clock signal CLK1 in the data input/output circuit 36_79 are almost the same or are synchronized. The same is true of the other data input/output circuits 36_1 through 36_78. Thus, when a write operation is performed, a timing of inputting data DAT and a timing for inputting a first clock CLK1 in each of the data input/output circuit 36_0 through 36_79 are almost synchronized.

1.5.2 Example of Read Operation

Next, transmission of data and a first clock signal CLK1 when a read operation is performed will be described using FIG. 7. The example of FIG. 7 shows a transmission path of read data DAT<79:0> and a first clock signal CLK1 when a read operation is performed in plane PLN0.

As shown in FIG. 7, the chip controller 13 sets the control signals RS1 and RSa to "H" level, and the control signals WS1 and WSa to "L" level. Thus, the three-state buffers 201, 241, 231, 221, 211 are in an operating state in the path of the first clock signal line C1L and the clock signal line P0C1L. And the three-state buffers 251, 261, 271, 281, and 291 are in an operating state in the path of the first data path DP1. As a result, in the clock signal line P0C1L, the first clock signal CLK1 is transmitted from the three-state buffer 201 toward the three-state buffers 241, 231, 221, and 211. Also read data DAT<79:0> is transmitted from the three-state buffer 251 toward the three-state buffers 292, 282, 272, and 262. Thus, the transmitting direction of the first clock signal CLK1 in the clock signal line P0C1L and the transmitting line of the data DAT in the first data path DP1 are the same.

In the first clock signal line C1L, an amount of delay (including a buffer delay and an interconnect delay) in the interconnect from branch point B1 to the three-state buffer 201 is referred to as tMCD. For example, focusing on the data input/output circuit 36_0 of division bock Div0, in the first clock signal CLK1 that is input to the data input/output circuit 36_0, an amount of delay tMCD, a buffer delay (5×tBD) due to the three-state buffers 201, 241, 231, 221, and 211, and an interconnect delay (5×tRC) due to the interconnect from the three-state buffer 201 to the data input/output circuit 36_0 occur. Also in the data DAT<0> that is output from the data input/output circuit 36_0, a buffer delay (tBD) due to the three-state buffer 251 occurs. Accordingly, an amount of delay in the read access to the data input/output circuit 36 has the following relationship:

An amount of delay in the data DAT<0>: tMCD+6×tBD+5×tRC

And focusing on the data input/output circuit 36_79 of division block Div4, in the first clock signal CLK1 that is input to the data input/output circuit 36_79, an amount of delay tMCD and a buffer delay (tBD) due to the three-state buffer 201 occur. Also in the data DAT<79> that is output from the data input/output circuit 36_79, a buffer delay (5×tBD) due to the three-state buffers 291, 281, 271, 261, and 251, and an interconnect delay (5×tRC) due to the interconnect from the data input/output circuit 36_79 to the three-state buffer 251 occur.

Accordingly, an amount of delay in a read access to the data input/output circuit 36_79 has the following relationship:

An amount of delay in the data DAT<79>: tMCD+6×tBD+5×tRC

Thus, the amounts of delay in the data DAT<0> through DAT<79> in a read operation are almost the same or synchronized.

1.6 Advantageous Effects According to Present Embodiment

The configuration according to the present embodiment can improve reliability of a semiconductor memory device. Such effects will be described in detail.

Figure 9:
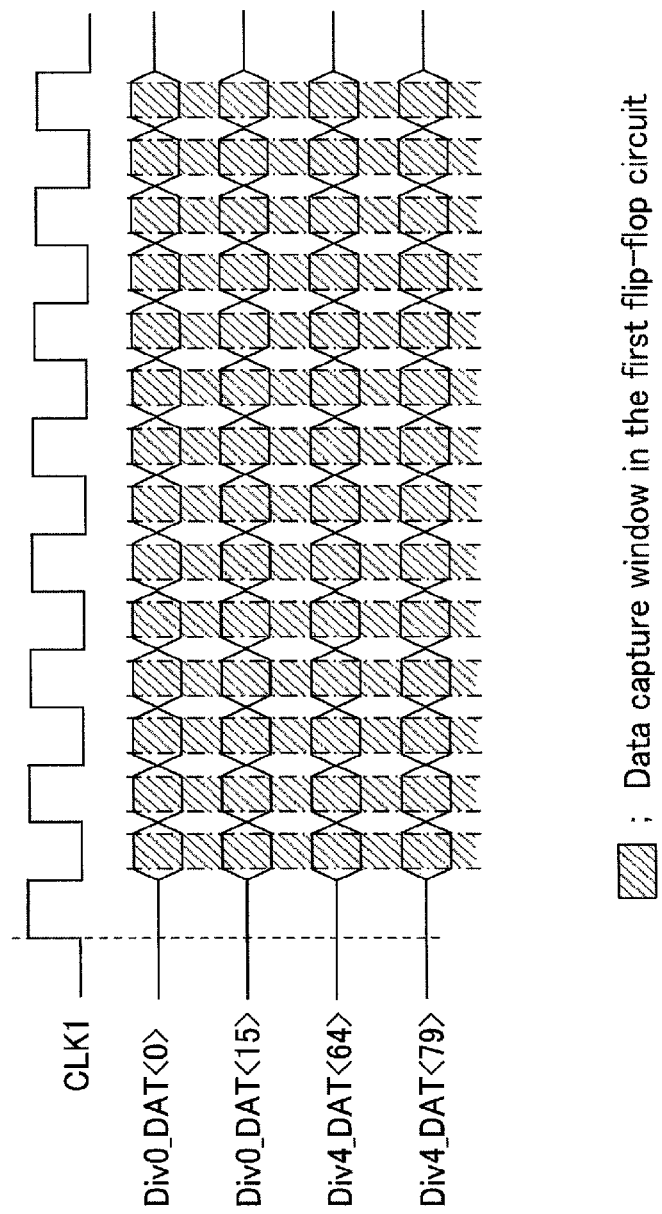
FIG. 9 is a timing chart showing a clock signal and read data when a read operation is performed in the semiconductor memory device according to the first embodiment.

First, a specific example of the timing chart of read data will be described using FIGS. 8 and 9. FIG. 8 shows a timing chart of read data when the transmitting direction of the first clock signal CLK1 is different from that of the read data in plane PLN0 as a comparative example. More specifically, for example, the timing chart of FIG. 8 shows the read data when a first clock signal CLK1 is transmitted from the three-state buffer 200 to the clock signal line P0C1L during a read operation. FIG. 9 shows a timing chart of read data in plane PLN0 in the present embodiment. It should be noted that the examples of FIGS. 8 and 9 show the timing of the data that is output from the data input/output circuits 36_0 and 36_15 of division block Div0 (shown as Div0 DAT<0> and Div0 DAT<15> in the chart) and the data that is output from the data input/output circuits 36_64 and 36_79 of division block Div4 (shown as Div4 DAT<64> and Div4 DAT<79> in the chart), as a part of read data.

As shown in FIG. 8, in a read operation, if the transmitting direction of the first clock signal CLK1 and the transmitting direction of the data DAT are different, the difference causes a delay in the time when the first clock signal CLK1 is input to the data input/output circuits 36_15, 36_64, and 36_79, and further causes a delay in the time when the output data reaches, for example, the first flip-flop circuit 11a. Thus, an amount of delay becomes larger in the order of the data DAT<0>, DAT<15>, DAT<64>, and DAT<79>. For example, when the data DAT<79:0> is latched collectively in the first flip-flop circuit 11a, the data capture window becomes narrower because of the timing shift in the data DAT<79:0>, and a possibility of erroneous reading increases due to an error in fetching of data into the flip-flop. Since the data capture window becomes narrower as an output frequency becomes higher, it is difficult to achieve stable passing of data under a high-rate operation.

In contrast, with the configuration according to the present embodiment, it is possible to perform complementary driving of the clock signal line P0C1L, and to control the direction of a clock signal when a write operation and a read operation are performed. It is thus possible to make the transmitting direction of the clock signal and the read data the same even in a read operation.

As shown in FIG. 9, in a read operation, it is possible to suppress variations in the amounts of delay in the data input/output circuits 36_0, 36_15, 36_64, and 36_79 by making the transmitting direction of the first clock signal CLK1 and the data DAT the same. It is thus possible to suppress shifts in the time when the data DAT<79:0> reaches, for example, the first flip-flop circuit 11a. Accordingly, a sufficient data capture window in the first flip-flop circuit 11a (or in the second flip-flop circuit 11b) can be reserved, thereby suppressing erroneous reading. The reliability of the semiconductor memory device can be thus improved.

Moreover, since it is possible to suppress the data capture window becoming narrower, the semiconductor memory device can deal with an output signal (clock signal) of a higher frequency, and performance of the semiconductor memory device can be thus improved.

2. Second Embodiment

Next, the second embodiment will be described. In the second embodiment, a transmission path of a second clock signal to the first flip-flop circuit 11a when a read operation is performed will be described. Hereinafter, only the matters different from the first embodiment will be described.

2.1 Configurations of Clock Signal Line and Data Path

First, the configurations of a clock signal line and a data path will be described using FIG. 10. The example of FIG. 10 shows the couplings and layout of planes PLN0, PLN4, PLN8, PLN12, and the first clock signal line C1L, and the first data path DP1, and the couplings and layout of the first flip-flop circuit 11a and the signal lines for the second clock signal CLK2. The couplings between the other planes PLN and the data path and between the other planes PLN and the clock signal lines are similar to this example. It should be noted that in the example of FIG. 10, the row decoders 31a and 31b, the column decoders 32a and 32b, the sense amplifier 33, and the page buffer 34 in planes PLN0, PLN4, PLN8, and PLN12 are omitted to simplify the explanation. In addition, the buffer 203 and the bidirectional buffer circuits 210, 220, 230, 240, 260, 270, 280, and 290, which are described with reference to FIG. 5 in the foregoing description of the first embodiment, are omitted. Furthermore, the other planes (i.e., PLN1, PLN5, PLN9, and PLN13) coupled to the first clock signal line C1L and first data path DP1 are omitted.

As shown in FIG. 10, a first clock signal CLK1 is transmitted to each of the planes PLN via the first clock signal line C1L. More specifically, the first clock signal line C1L is arranged along the data input/output circuits 36_0 through 36_79 included in each of the planes PLN0, PLN4, PLN8, and PLN12. And in the example of FIG. 10, the first clock CLK1 is transmitted from the bottom toward the top of the drawing sheet. Also in the example of FIG. 10, buffers 202a through 202d which function as high-power drivers for relaying a signal are provided on the first clock signal line C1L. The buffers 202a through 202d correspond to the buffer 202 which is explained with reference to FIG. 5 in the foregoing description of the first embodiment. It should be noted that the number of buffers to be coupled to the first clock signal line C1L can be discretionarily set.

Similarly to FIG. 5 of the first embodiment, planes PLN0, PLN4, PLN8, and PLN12 are respectively coupled to corresponding clock signal lines P0C1L, P4C1L, P8C1L, and P12C1L. Both ends of the clock signal line P0C1L are coupled to the first clock signal line C1L via two three-state buffers 200a and 201a. Both ends of the clock signal line P4C1L are coupled to the first clock signal line C1L via two three-state buffers 200b and 201b. Both ends of the clock signal line P8C1L are coupled to the first clock signal line C1L via two three-state buffers 200c and 201c. Both ends of the clock signal line P12C1L are coupled to the first clock signal line C1L via two three-state buffers 200d and 201d.

The three-state buffers 200a through 200d correspond to the three-state buffer 200 described with reference to FIG. 5 in the foregoing description of the first embodiment, and they are respectively controlled based on the control signals WS1 through WS4 transmitted from the chip controller 13. The control signals WS1, WS2, WS3, and WS4 are respectively set to "H" level when a write operation is performed in plane PLN0, PLN4, PLN8, and PLN12. The three-state buffers 201a through 201d correspond to the three-state buffer 201 described with reference to FIG. 5 in the description of the first embodiment, and they are respectively controlled based on the control signals RS1 through RS4 transmitted from the chip controller 13. The control signals RS1, RS2, RS3, and RS4 are respectively set to "H" level when a read operation is performed in plane PLN0, PLN4, PLN8, and PLN12.

First data path DP1 is arranged along the first clock signal line C1L, for example. In the path of first data path DP1, four bidirectional buffer circuits 250a through 250d are provided. The bidirectional buffer circuits 250a through 250d correspond to the bidirectional buffer circuit 250 which is described with reference to FIG. 5 in the foregoing description of the first embodiment. More specifically, from one end toward the other end of first data path DP1 coupled to the first flip-flop circuit 11a, the bidirectional buffer circuit 250a, plane PLN0, the bidirectional buffer circuit 250b, plane PLN4, the bidirectional buffer circuit 250c, plane PLN8, the bidirectional buffer circuit 250d, and plane PLN12 are coupled to first data path DP1 in this order.

The bidirectional buffer circuit 250a includes two three-state buffers 251a and 252a. Similarly, the bidirectional buffer circuit 250b includes two three-state buffers, 251b and 252b. The bidirectional buffer circuit 250c includes two three-state buffers 251c and 252c. The bidirectional buffer circuit 250d includes two three-state buffers 251d and 252d.

The three-state buffers 251a through 251d correspond to the three-state buffer 251 described with reference to FIG. 5 in the foregoing description of the first embodiment, and they are respectively controlled based on the control signals RSa through RSd transmitted from the chip controller 13. The control signal RSa is set to "H" level when data is read from planes PLN0, PLN4, PLN8, and PLN12. The control signal RSb is set to "H" level when data is read from planes PLN0, PLN4, PLN8, and PLN12. The control signal RSc is set to "H" level when data is read from planes PLN8 and PLN12. The control signal RSd is set to "H" level when data is read from plane PLN12.

The three-state buffers 252a through 252d correspond to the three-state buffer 252 described with reference to FIG. 5 in the foregoing description of the first embodiment, and they are respectively controlled based on the control signals WSa through WSd transmitted from the chip controller 13. The control signal WSa is set to "H" level when data is written from planes PLN0, PLN4, PLN8, and PLN12. The control signal WSb is set to "H" level when data is written from planes PLN0, PLN4, PLN8, and PLN12. The control signal WSc is set to "H" level when data is written from planes PLN8 and PLN12. The control signal WSd is set to "H" level when data is written from plane PLN12.

Next, the second clock signal CLK2 that is input to the first flip-flop circuit 11a will be described. The second clock signal CLK2 is input to the first flip-flop circuit 11a via a different transmission path in accordance with a plane PLN to be read.

More specifically, if plane PLN0 is selected as a target for reading, a first path using the clock signal lines C2L1, C2L2, and C2L9 is selected, and if plane PLN4 is selected as a target for reading, a second path using the clock signal lines C2L1 through C2L3, C2L8, and C2L9 is selected. Also if plane PLN8 is selected as a target for reading, a third path using the clock signal lines C2L1 through C2L4 and C2L7 through C2L9 is selected, and when plane PLN12 is selected as a target for reading, a fourth path using the clock signal lines C2L1 through C2L9 is selected.

The clock signal lines C2L1 through C2L9 are arranged along the first clock signal line C1L and the first data path DP1. More specifically, the clock signal lines C2L2 through C2L5 are preferably arranged in the proximity of the first clock signal line C1L, so that the first clock signal line C1L and the clock signal lines C2L2 through C2L5 are equally affected by noise caused by a power-supply voltage interconnect and a ground voltage interconnect (not shown). Similarly, the clock signal line C2L6 is preferably arranged in the proximity of the clock signal line P12C1L, so that the first clock signal line P12C1L and the clock signal line C2L6 are equally affected by noise caused by a power-supply voltage interconnect and a ground voltage interconnect (not shown). The clock signal line C2L7 is preferably arranged in the proximity of the clock signal line P8C1L, so that the clock signal line P8C1L and the clock signal line C2L7 are equally affected by noise caused by a power-supply voltage interconnect and a ground voltage interconnect (not shown). The clock signal line C2L8 is preferably arranged in the proximity of the clock signal line P4C1L, so that the clock signal line P4C1L and the clock signal line C2L8 are equally affected by noise caused by a power-supply voltage interconnect and a ground voltage interconnect (not shown). The clock signal line C2L9 is preferably arranged in the proximity of the clock signal line P0C1L, so that the clock signal line P0C1L and the clock signal line C2L9 are equally affected by noise caused by a power-supply voltage interconnect and a ground voltage interconnect (not shown).

In the path of the clock signal lines C2L1 through C2L9, a buffer 300, switching circuits 310, 320, and 330 for switching transmission paths, and a three-state buffer 301 are provided.

The input terminal of the buffer 300 is coupled to the clock generator 14 through the clock signal line C2L1, and the output terminal is coupled to the clock signal line C2L2.

The switching circuit 310 includes two three-state buffers 311 and 312, and a multiplexer 313. The input terminal of the three-state buffer 311 is coupled to the clock signal line C2L2, the output terminal is coupled to the clock signal line C2L3, and the control signal RSb is input to the control terminal. The input terminal of the three-state buffer 312 is coupled to the clock signal line C2L2, the output terminal is coupled to one input terminal of the multiplexer 313, and the control signal RS1 is input to the control terminal. The other input terminal of the multiplexer 313 is coupled to the clock signal line C2L8, and the output terminal is coupled to the clock signal line C2L9. The multiplexer 313 couples the output terminal of the three-state buffer 312 to the clock signal line C2L9 when the control signal RS1 is at "H" level, and couples the clock signal line C2L8 to the clock signal line C2L9 when the control signal RS1 is at "L" level.

The switching circuit 320 includes two three-state buffers 321 and 322, and a multiplexer 323. The input terminal of the three-state buffer 321 is coupled to the clock signal line C2L3, the output terminal is coupled to the clock signal line C2L4, and the control signal RSc is input to the control terminal. The input terminal of the three-state buffer 322 is coupled to the clock signal line C2L3, the output terminal is coupled to one input terminal of the multiplexer 323, and the control signal RS2 is input to the control terminal. The other input terminal of the multiplexer 323 is coupled to the clock signal line C2L7, and the output terminal is coupled to the clock signal line C2L8. The multiplexer 323 couples the output terminal of the three-state buffer 322 to the clock signal line C2L8 when the control signal RS2 is at "H" level, and couples the clock signal line C2L7 to the clock signal line C2L8 when the control signal RS2 is at "L" level.

The switching circuit 330 includes two three-state buffers 331 and 332, and a multiplexer 333. The input terminal of the three-state buffer 331 is coupled to the clock signal line C2L4, the output terminal is coupled to the clock signal line C2L5, and the control signal RSd is input to the control terminal. The input terminal of the three-state buffer 332 is coupled to the clock signal line C2L4, the output terminal is coupled to one input terminal of the multiplexer 333, and the control signal RS3 is input to the control terminal. The other input terminal of the multiplexer 333 is coupled to the clock signal line C2L6, and the output terminal is coupled to the clock signal line C2L7. The multiplexer 333 couples the output terminal of the three-state buffer 332 to the clock signal line C2L7 when the control signal RS3 is at "H" level, and couples the clock signal line C2L6 to the clock signal line C2L7 when the control signal RS3 is at "L" level.

The input terminal of the three-state buffer 301 is coupled to the clock signal line C2L5, the output terminal is coupled to the clock signal line C2L6, and the control signal RS4 is input to the control terminal.

2.2 Specific Examples of Transmissions of Data and First and Second Clock Signals in Read Operation Next, specific examples of transmission of the data DAT<79:0>, the first clock signal CLK1, and the second clock signal CLK2 when a read operation is performed will be described using FIGS. 11 and 12. In the example of FIG. 11, plane PLN0 is selected as a target for reading, and in the example of FIG. 12, plane PLN12 is selected as a target for reading.

As shown in FIG. 11, if plane PLN0 is selected, the chip controller 13 sets the control signals RS1 and RSa to "H" level, and the control signals RS2 through RS4, RSb through RSd, WS1 through WS4, and WSa through WSd to "L" level. The first clock signal CLK1 is thus transmitted to plane PLN0 via the three-state buffer 201a. The data DAT<79:0> is transmitted to the first flip-flop circuit 11a via the three-state buffer 251a. Also the second clock signal CLK2 is transmitted to the first flip-flop circuit 11a via the first path, that is, via the clock signal lines C2L1 and C2L2, the three-state buffer 311, and the clock signal line C2L9.

As shown in FIG. 12, if plane PLN12 is selected, the chip controller 13 sets the control signals RS4 and RSa through RSd to "H" level, and the control signals RS1 through RS3, WS1 through WS4, and WSa through WSd to "L" level. The first clock signal CLK1 is thus transmitted to plane PLN12 via the three-state buffer 201d. The data DAT<79:0> is transmitted to the first flip-flop circuit 11a via the three-state buffers 251a through 251d. The second clock signal CLK2 is transmitted to the first flip-flop circuit 11a through the fourth path, that is, through the clock signal lines C2L1 through C2L9.

2.3 Advantageous Effects According to Present Embodiment

The configuration of the present embodiment achieves advantageous effects similar to those achieved by the first embodiment.

Furthermore, with the configuration according to the present embodiment, fluctuations of a duty ratio of read data, an amount of delay, and a cycle of the read data, which are due to noise caused by voltage fluctuations in a power-supply voltage interconnect or a ground voltage interconnect, can be reduced, and erroneous reading can be suppressed, thereby improving reliability of a semiconductor memory device.

For example, when a cell read operation, etc., is performed in a plane PLN within a range from the memory cell array 30 to the page buffer 34, while a read operation is being performed in another plane PLN, fluctuations in a power-supply voltage or floating of a ground voltage (a rise of a ground voltage) may occur. As a result, voltage fluctuations in a power-supply voltage interconnect and a ground voltage interconnect become noise, and a duty ratio, an amount of delay, and a cycle of the first clock signal CLK1 and the read data fluctuate (hereinafter, the fluctuations of a duty ratio, an amount of delay, and a cycle will be simply referred to as "pulse fluctuations"). Such pulse fluctuations in the first clock signal CLK1 and the read data (data DAT<79:0>) are dependent on an arrangement of a plane PLN, a voltage generator (a power-supply voltage interconnect), and a ground voltage terminal (a ground voltage interconnect). For example, in the core section 2, suppose plane PLN0 is arranged closer to the voltage generator and the ground voltage terminal than plane PLN 12. Then, plane PLN0 is less susceptible to fluctuations of a power-supply voltage and to floating of a ground voltage even when a cell read operation is performed in, for example, plane PLN12, and pulse fluctuations in the first clock signal CLK1 and the read data are therefore relatively small. In contrast, plane PLN12 is susceptible to fluctuations of a power supply voltage and to floating of a ground voltage when a cell read operation is performed in, for example, plane PLN0, and pulse fluctuations in the first clock signal CLK1 and the read data therefore become relatively large. Thus, if pulse fluctuations in the clock signal and the read data are different between the planes PLN, a suitable timing for latching data in the first flip-flop circuit 11a, for example, may vary from one plane PLN to another.

Figure 13:
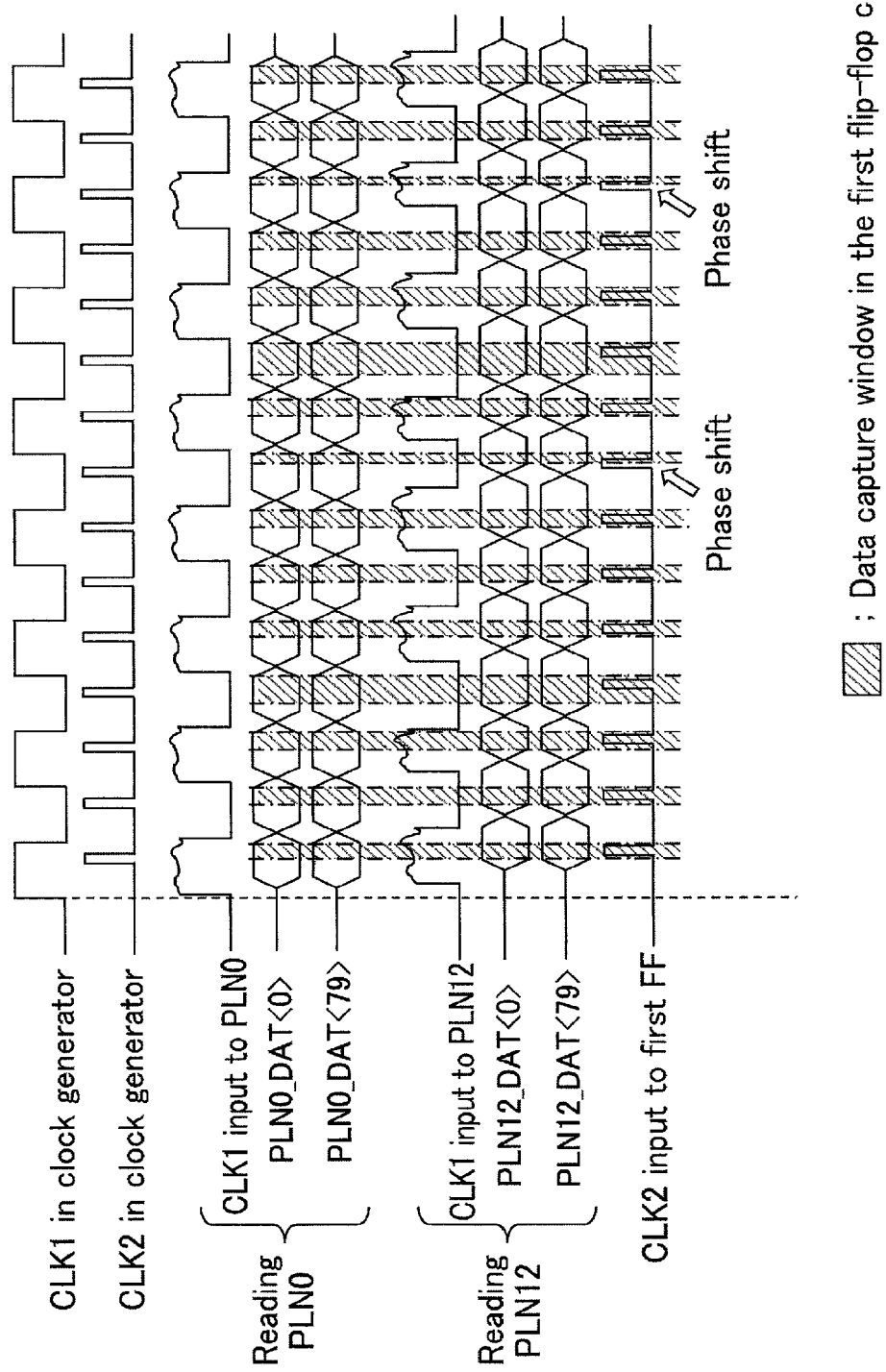
FIG. 13 is a timing chart showing a clock signal and read data when a read operation is performed in a comparative example.
Figure 14:
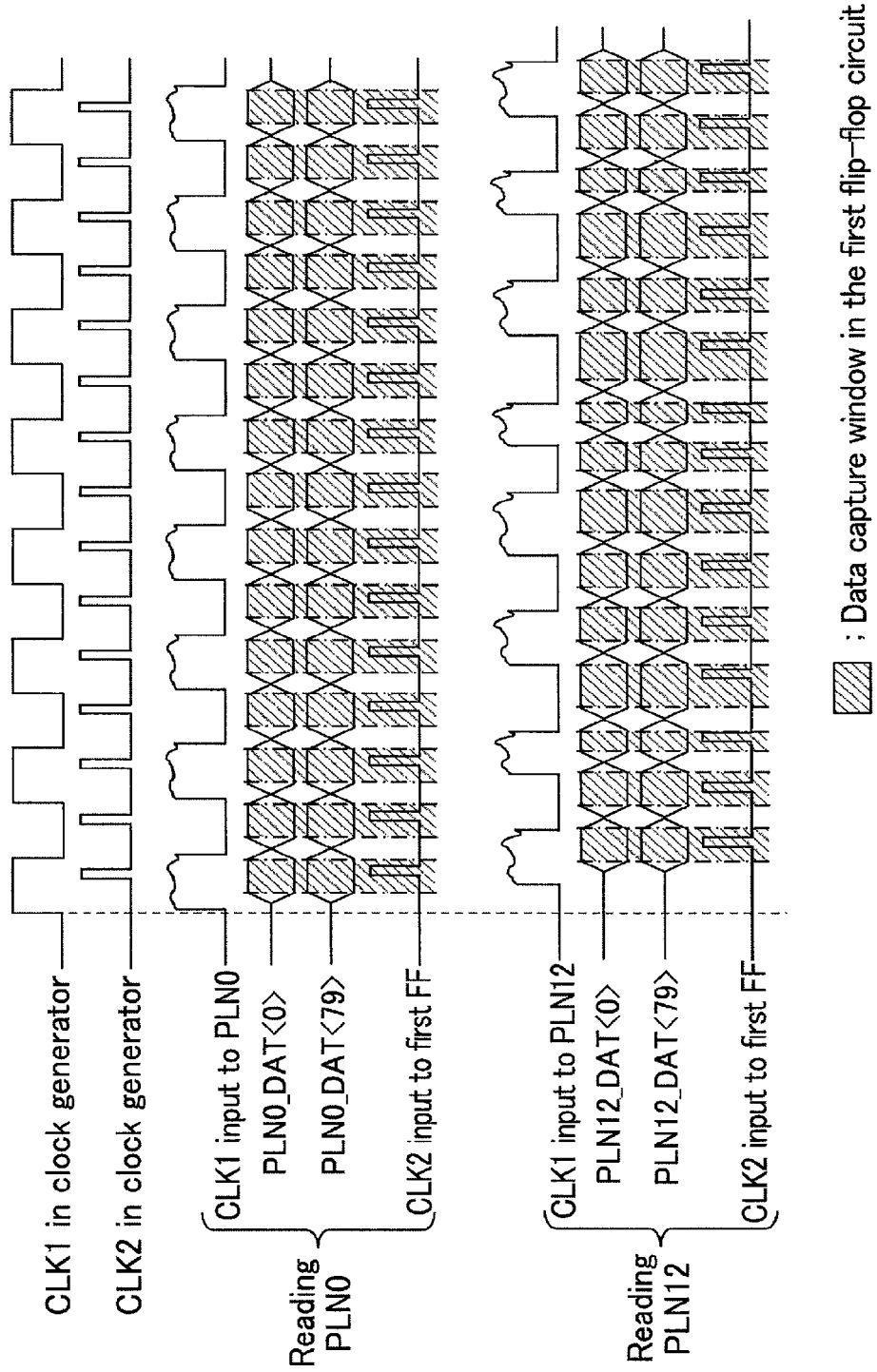
FIG. 14 is a timing chart showing a clock signal and read data when a read operation is performed in the semiconductor memory device according to the second embodiment.

A specific example of a timing chart of read data when a cell read operation is performed in another plane PLN will be described using FIGS. 13 and 14. FIG. 13 shows, as a comparative example, a case where the data that is read from plane PLN0 and plane PLN12 are latched at the same timing in the first flip-flop circuit 11a. More specifically, the second clock signal CLK2 is input to the first flip-flop circuit 11a via, for example, a first path, that is, via the three-state buffer 312, regardless of a selected plane PLN. FIG. 14 shows a case where the data that is read from plane PLN0 and plane PLN12 are latched at a different timing in the first flip-flop circuit 11a. It should be noted that the examples of FIGS. 13 and 14 show the timing of the data that is output from the data input/output circuits 36_0 and 36_79 of plane PLN0 (shown as PLN_DAT<0> and PLN0_DAT<79> in the chart) and the data that is output from the data input/output circuits 36_0 and 36_79 of plane PLN12 (shown as PLN12_DAT<0> and PLN12_DAT<79> in the chart), as a part of read data. Also in the examples of FIGS. 13 and 14, similarly to the first embodiment, the transmitting direction of the first clock signal CLK1 in the clock signal lines corresponding to a selected plane PLN (P0C1L and P12C1L) is the same as the transmitting direction of the data DAT<79:0> in the first data path DP1.

As shown in FIG. 13, when an operation of reading plane PLN0 is performed, the first clock signal CLK1 to be input to plane PLN0 is less susceptible to fluctuations of a power-supply voltage and to the floating of a ground voltage due to a cell read operation in other planes PLN. Furthermore, since plane PLN0 is arranged relatively closer to the clock generator 14 in the core section 2, the influence of an interconnect delay (and a buffer delay) in a range from the clock generator 14 to plane PLN0 is relatively small. For this reason, the pulse fluctuations in the first clock signal CLK1 that is input to plane PLN0 are relatively small. In plane PLN0, the data DAT<79:0> is output based on the input clock signal CLK1.

In contrast, when an operation of reading plane PLN12 is performed, plane PLN12 is more susceptible than plane PLN0 to the influence of the fluctuations of the power-supply voltage and to the floating of a ground voltage due to a cell read operation performed in other planes PLN. Furthermore, since plane PLN12 is arranged relatively remote from the clock generator 14 in the core section 2, the influence of an interconnect delay (and a buffer delay) in a range from the clock generator 14 to plane PLN0 is relatively larger than in plane PLN0. For this reason, the pulse fluctuations in the first clock signal CLK1 to be input to plane PLN12 are larger than the pulse fluctuations in the first clock signal CLK1 to be input to plane PLN0. In plane PLN12, data DAT<79:0> is output based on the input clock signal CLK1. Thus, the pulse fluctuations in the output data DAT<79:0> differ between plane PLN0 and plane PLN12.

If a timing of the second clock signal CLK2 to be input to the first flip-flop circuit 11a is the same regardless of a selected plane PLN as a target for reading, a data capture window for fetching the data DAT<70:0> that is output from plane PLN0 or plane PLN12 in the first flip-flop circuit 11a becomes narrower with respect to the pulse width of the data DAT<79:0> in accordance with a difference in pulse fluctuations. For example, if the second clock signal CLK2, similarly to the first clock signal CLK1 to be input to plane PLN0, is less susceptible to fluctuations of a power-supply voltage and to the floating of a ground voltage, a difference between a cycle of the second clock signal CLK2 and a cycle of the read data in plane PLN12 becomes greater. Then, errors in data fetching may occur due to a phase shift between the data capture window and the second clock signal CLK2 in the first flip-flop circuit 11a.

In contrast, with the configurations according to the present embodiment, a transmission path for the second clock signal CLK2 to be input to the first flip-flop circuit 11a can be changed in accordance with a selected plane PLN. Thus, if the first clock signal CLK1 and the read data that are to be input to a selected plane are affected by fluctuations of a power-supply voltage and a ground voltage, the second clock signal CLK2 can also be affected by the fluctuations of a power-supply voltage and a ground voltage, and a timing of latching the read data in the first flip-flop circuit 11a can be thereby adjusted in accordance with the selected plane PLN.

More specifically, as shown in FIG. 14, when a read operation is performed in plane PLN0, the second clock signal CLK2 is input to the first flip-flop circuit 11a through the first path which is described with reference to FIG. 11. Accordingly, the first clock signal CLK1 and the second signal CLK2 are equally affected by fluctuations of a power-supply voltage and a ground voltage. It is thus possible to prevent the data capture window in the first flip-flop circuit 11a from becoming narrower. If a read operation is performed in plane PLN12, the second clock signal CLK2 is input to the first flip-flop circuit 11a via the fourth path described with reference to FIG. 12. Accordingly, similarly to the case of plane PLN0, the first clock signal CLK1 and the second clock signal CLK2 are equally affected by fluctuations of a power-supply voltage and a ground voltage. It is thus possible to suppress a data capture window becoming narrower in the first flip-flop circuit 11a.

Accordingly, errors in data fetching in a flip-flop can be reduced, and read errors can be thereby suppressed. Accordingly, the reliability of the semiconductor memory device can be improved.

Moreover, since it is possible to suppress the data capture window becoming narrower, the semiconductor memory device can deal with an output signal (clock signal) of a higher frequency, and performance of the semiconductor memory device can be thus improved.

3. Modification, Etc.

The semiconductor memory device according to the above embodiment includes: a memory cell array (30) including first and second memory blocks (Div0, Div1) each including a plurality of memory cells; a first input/output buffer circuit (35) that is used for inputting and outputting data to and from the first memory block; a second input/output buffer circuit (35) that is used for inputting and outputting data to and from the second memory block; a clock generator (14) that generates a clock signal (CLK1); a first clock signal line (C1L) coupled to the clock generator; a second clock signal (P0C1L) to which the first and second input/output buffer circuits are coupled from one end toward the other end; a first buffer (200) in which an input terminal is coupled to the first clock, and an output terminal is coupled to the one end of the second clock signal line; and a second buffer (201) in which an input terminal is coupled to a first clock signal line and an output terminal is coupled to the other end of the second clock signal line. When a write operation is performed, a clock signal is input to the first and second input/output buffer circuits via the first buffer, and when a read operation is performed, a clock signal is input to the first and second input/output buffer circuits through the second buffer.

By applying the above embodiments, it is possible to provide a semiconductor memory device that can be improved in reliability.

The embodiments are not limited to the above-described aspects, but can be modified in various ways.

Furthermore, in the above embodiments, the semiconductor memory device may be a flat NAND flash memory in which memory cell transistors are two-dimensionally arranged on a semiconductor substrate, or may include other types of memory. In addition, the term "couple" in the above embodiments also includes a state of indirect coupling via, for example, a transistor, a resistor, etc. or the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a memory cell array including a first memory block and a second memory block, each having a plurality of memory cells;
   a first input/output buffer circuit that is used for inputting and outputting data to and from the first memory block;
   a second input/output buffer circuit that is used for inputting and outputting data to and from the second memory block;
   a clock generator that generates a clock signal;
   a first clock signal line coupled to the clock generator;
   a second clock signal line to which the first input/output buffer circuit and the second input/output buffer circuit are coupled to the second clock signal line in the order from one end toward an other end of the second clock signal line;
   a first buffer in which an input terminal is coupled to the first clock signal line and an output terminal is coupled to the one end of the second clock signal line; and
   a second buffer in which an input terminal is coupled to the first clock signal line and an output terminal is coupled to the other end of the second signal line,
   wherein the clock signal is input to the first and second input/output buffer circuits via the first buffer when a write operation is performed, and
   the clock signal is input to the first and second input/output buffer circuits via the second buffer when a read operation is performed.

2. The device according to claim 1, further comprising a data path coupled to the first and second input/output buffer circuits,
   wherein the first and second input/output buffer circuits input write data from the data path in accordance with the clock signal when the write operation is performed, and output read data to the data path in accordance with the clock signal when the read operation is performed.

3. The device according to claim 2, further comprising a flip-flop circuit coupled to one end of the data path,
   wherein the first input/output buffer circuit and the second input/output buffer circuit are coupled to the data path in the order from the one end toward an other end of the data path.

4. The device according to claim 2, wherein the data path and the second clock signal line are arranged along a first direction, and
   a transmitting direction of data in the data path and a transmitting direction of the clock signal in the second clock signal line are the same in the write operation and the read operation.

5. The device according to claim 1, wherein the first and second buffer are three-state buffers.

6. The device according to claim 5, wherein the first buffer is in an on state when the write operation is performed, and the second buffer is in an on state when the read operation is performed.

7. The device according to claim 1, further comprising:
   a first sense amplifier and a second sense amplifier that respectively correspond to the first memory block and the second memory block;
   a first page buffer circuit that couples the first sense amplifier to the first input/output buffer circuit; and
   a second page buffer circuit that couples the second sense amplifier to the second input/output buffer circuit.

8. The device according to claim 3, further comprising an input/output circuit that is coupled to the flip-flop circuit and inputs and outputs data to and from an external device.

9. The device according to claim 1, wherein the memory cell includes a charge storage layer.

10. The device according to claim 1, the device being a NAND flash memory.

11. A semiconductor memory device comprising:
    a first plane and a second plane, each including a memory cell array comprising a plurality of memory cells;
    a data path to which the first and second planes are coupled to the data path in the order from one end toward an other end of the data path;
    a clock generator that generates a first clock signal and a second clock signal;
    a first clock signal line and a second clock signal line to which the first and second clock signals are transmitted, each of the first and second clock signal line are coupled to the clock generator at one end of each clock signal line;
    a third clock signal line coupled to the first plane;
    a fourth clock signal line coupled to the second plane;
    a first buffer in which an input terminal is coupled to the first clock signal line and an output terminal is coupled to one end of the third clock signal line;
    a second buffer in which an input terminal is coupled to the first clock signal line and an output terminal is coupled to an other end of the third clock signal line;
    a third buffer in which an input terminal is coupled to the first clock signal line and an output terminal is coupled to one end of the fourth clock signal line;
    a fourth buffer in which an input terminal is coupled to the first clock signal line and an output terminal is coupled to an other end of the fourth clock signal line;
    a flip-flop circuit that is coupled to the one end of the data path and that latches read data in accordance with the second clock signal; and
    a first switching circuit and a second switching circuit that are coupled to the second clock signal line in the order from the one end toward an other end of the second clock signal line,
    wherein the first through fourth buffer are coupled to the first clock signal line in the order from the one end toward an other end of the first clock signal line,
    when a read operation is performed in the first plane, the first clock signal is input to the first plane via the second buffer, and the second clock signal is input to the flip-flop circuit via the first switching circuit, and when a read operation is performed in the second plane, the first clock signal is input to the second plane via the fourth buffer, and the second clock signal is input to the flip-flop circuit via the first and second switching circuits.

12. The device according to claim 11, wherein the memory cell array includes a plurality of memory blocks, each having a plurality of memory cells, and each of the first and the second planes includes:
a plurality of sense amplifiers respectively corresponding to the plurality of memory blocks;
a plurality of page buffer circuits respectively corresponding to the plurality of sense amplifiers; and
a plurality of input/output buffer circuits that respectively correspond to the plurality of page buffer circuits and that latch data in accordance with the first signal.

13. The device according to claim 11, wherein the plurality of input/output buffer circuits input or output data in accordance with the first clock signal.

14. The device according to claim 11, wherein
the first switching circuit includes:
a first circuit in which an input terminal is coupled to the clock generator via a first interconnect and an output terminal is coupled to the second switching circuit via a second interconnect;
a second circuit in which an input terminal is coupled to the first interconnect; and
a first multiplexer in which a first input terminal is coupled to an output terminal of the second circuit, a second input terminal is coupled to the second switching circuit via a third interconnect, and an output terminal is coupled to the flip-flop circuit via a fourth interconnect, the second switching circuit includes:
a third circuit in which an input terminal is coupled to a second interconnect and an output terminal is coupled to a fifth interconnect;
a fourth circuit in which an input terminal is coupled to the second interconnect; and
a second multiplexer in which a first input terminal is coupled to an output terminal of the fourth circuit, a second input terminal is coupled to a sixth interconnect, and an output terminal is coupled to the third interconnect.

15. The device according to claim 14, wherein
when a read operation is performed in the first plane, the second clock signal is input to the flip-flop via the first interconnect, the second circuit, the first multiplexer, and the fourth interconnect, and when a read operation is performed in the second plane, the second clock signal is input to the flip-flop via the first interconnect, the first circuit, the second interconnect, the fourth circuit, the second multiplexer, the third interconnect, the first multiplexer, and the fourth interconnect.

16. The device according to claim 11, wherein the first through fourth buffers are three-state buffers.

17. The device according to claim 16, wherein
the first buffer is in an on state when a write operation is performed in the first plane,
the second buffer is in an on state when the write operation in the first plane is performed,
the third buffer is in an on state when the write operation in the second plane is performed, and
the fourth buffer is an on state when the read operation in the second plane is performed.

18. The device according to claim 11, wherein the memory cell includes a charge storage layer.

19. The device according to claim 11, the device being a NAND flash memory.

* * * * *